US011069713B2

(12) United States Patent
Takahashi et al.

(10) Patent No.: US 11,069,713 B2
(45) Date of Patent: Jul. 20, 2021

(54) SEMICONDUCTOR MEMORY ELEMENT, OTHER ELEMENTS, AND THEIR PRODUCTION METHODS

(71) Applicants: National Institute of Advanced Industrial Science and Technology, Tokyo (JP); WACOM R&D Corporation, Tokyo (JP)

(72) Inventors: Mitsue Takahashi, Ibaraki (JP); Shigeki Sakai, Ibaraki (JP); Masaki Kusuhara, Tokyo (JP); Masayuki Toda, Tokyo (JP); Masaru Umeda, Tokyo (JP); Yoshikazu Sasaki, Tokyo (JP)

(73) Assignees: NATIONAL INSTITUTE OF ADVANCED INDUSTRIAL SCIENCE AND TECHNOLOGY, Tokyo (JP); WACOM, Tokyo (JP)

( * ) Notice: Subject to any disclaimer, the term of this patent is extended or adjusted under 35 U.S.C. 154(b) by 0 days.

(21) Appl. No.: 16/315,784

(22) PCT Filed: Jul. 3, 2017

(86) PCT No.: PCT/JP2017/024402
§ 371 (c)(1),
(2) Date: May 13, 2019

(87) PCT Pub. No.: WO2018/008609
PCT Pub. Date: Jan. 11, 2018

(65) Prior Publication Data
US 2019/0273086 A1 Sep. 5, 2019

(30) Foreign Application Priority Data

Jul. 6, 2016 (JP) .............................. JP2016-134625
May 9, 2017 (JP) .............................. JP2017-092894

(51) Int. Cl.
H01L 27/1159 (2017.01)
H01L 29/78 (2006.01)
(Continued)

(52) U.S. Cl.
CPC ...... H01L 27/1159 (2013.01); H01L 21/0337 (2013.01); H01L 21/31116 (2013.01);
(Continued)

(58) Field of Classification Search
CPC .......... H01L 27/1159; H01L 27/11587; H01L 21/0337; H01L 21/31116; H01L 29/78391;
(Continued)

(56) References Cited

U.S. PATENT DOCUMENTS 7,221,013 B2   5/2007  Goto et al.
9,818,869 B2  11/2017  Sakai et al.
(Continued)

FOREIGN PATENT DOCUMENTS

JP  8-204159     8/1996
JP  2003-078051  3/2003
(Continued)

OTHER PUBLICATIONS

International Search Report, PCT/JP2017/024402, dated Aug. 29, 2017.

Primary Examiner — Timor Karimy
(74) Attorney, Agent, or Firm — Nixon & Vanderhye

(57) ABSTRACT

A semiconductor memory element is provided including a laminated structure, in which a memory member and a conductor are superposed on a semiconductor substrate. The memory member has a bottom surface in contact with the semiconductor substrate, an upper surface in contact with the conductor, and side surfaces, which are in contact with and surrounded by a partition wall; the bottom surface of the (Continued)

memory member has a width of equal to or not more than 100 nm; a shortest distance between the conductor and the semiconductor substrate is twice or more of the width of the bottom surface of the memory member; the side surface of the memory member has a width, which is either the same as the width of the bottom surface and constant at any position above the bottom surface, or the widest at a position other than the bottom surface and above the bottom surface.

22 Claims, 36 Drawing Sheets

(51) Int. Cl.
| | |
|---|---|
| *H01L 21/28* | (2006.01) |
| *H01L 21/311* | (2006.01) |
| *H01L 29/49* | (2006.01) |
| *H01L 29/51* | (2006.01) |
| *H01L 29/66* | (2006.01) |
| *H01L 27/11587* | (2017.01) |
| *H01L 21/033* | (2006.01) |

(52) U.S. Cl.
CPC .. *H01L 27/11587* (2013.01); *H01L 29/40111* (2019.08); *H01L 29/4983* (2013.01); *H01L 29/516* (2013.01); *H01L 29/6653* (2013.01); *H01L 29/6684* (2013.01); *H01L 29/66553* (2013.01); *H01L 29/78391* (2014.09)

(58) Field of Classification Search
CPC ........... H01L 29/40111; H01L 29/4983; H01L 29/516; H01L 29/6653; H01L 29/66553; H01L 29/6684
See application file for complete search history.

(56) References Cited

U.S. PATENT DOCUMENTS

| | | | |
|---|---|---|---|
| 2005/0051829 | A1 | 3/2005 | Goto et al. |
| 2010/0193849 | A1* | 8/2010 | Nishimura ............... H01L 28/55 |
| | | | 257/295 |
| 2011/0034020 | A1 | 2/2011 | Johnson |
| 2011/0075467 | A1 | 3/2011 | Hong et al. |
| 2015/0179657 | A1* | 6/2015 | Inumiya ............ H01L 27/11597 |
| | | | 257/295 |
| 2015/0380641 | A1 | 12/2015 | Ino et al. |
| 2016/0247932 | A1 | 8/2016 | Sakai et al. |
| 2016/0307908 | A1* | 10/2016 | Sharangpani ....... H01L 27/1157 |
| 2018/0130909 | A1 | 5/2018 | Sakai et al. |

FOREIGN PATENT DOCUMENTS

| | | |
|---|---|---|
| JP | 2004-172355 | 6/2004 |
| JP | 2005-072520 | 3/2005 |
| JP | 2010-182889 | 8/2010 |
| JP | 2010-258472 | 11/2010 |
| JP | 2016-046271 | 4/2016 |
| WO | WO 2015/012359 | 1/2015 |

* cited by examiner

FIG.30(A)  Occupation area of one memory is  (a) $8F^2$

A. Element isolation region and active region are formed.

White: Element isolation region
Gray: Active region

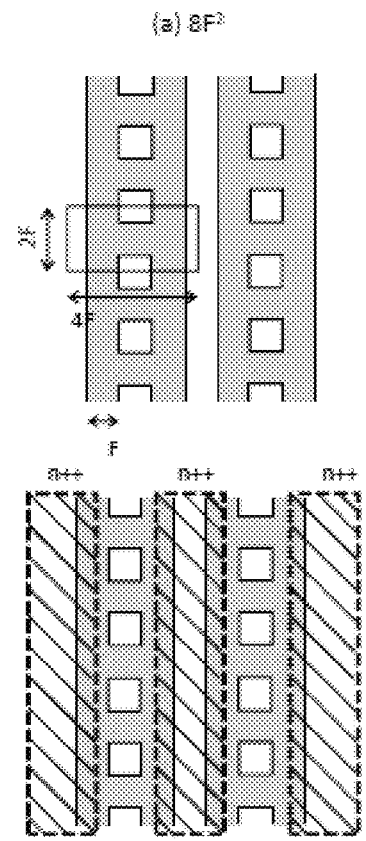

B. Deep ion injection n++ is executed.

Enclosed by dotted lines + Oblique lines: Region, in which deep ion injection is executed.

C. Patterns, which become FeFET later, are formed.

Black crossed oblique lines:
It is protruding structure in the case of embedded type, and it is etched gate lamination structure in the case of planar type.

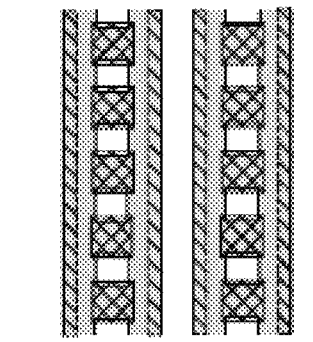

FIG.30(B)　　　Occupation area of one memory is　　　(b) 6F²

A. Element isolation region and active region are formed.

White: Element isolation region
Gray: Active region

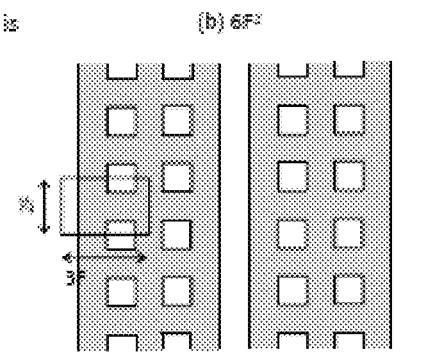

B. Deep ion injection n++ is executed.

Enclosed by dotted lines + Oblique lines: Region, in which deep ion injection is executed.

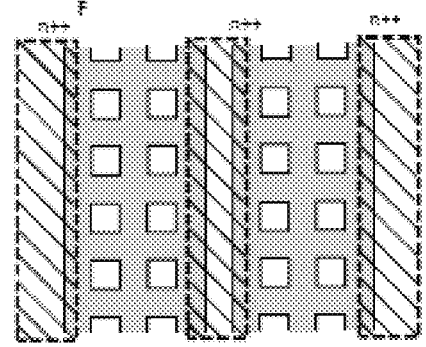

C. Patterns, which become FeFET later, are formed.

Black crossed oblique lines:
It is protruding structure in the case of embedded type, and it is etched gate lamination structure in the case of planar type.

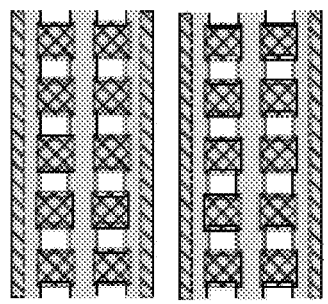

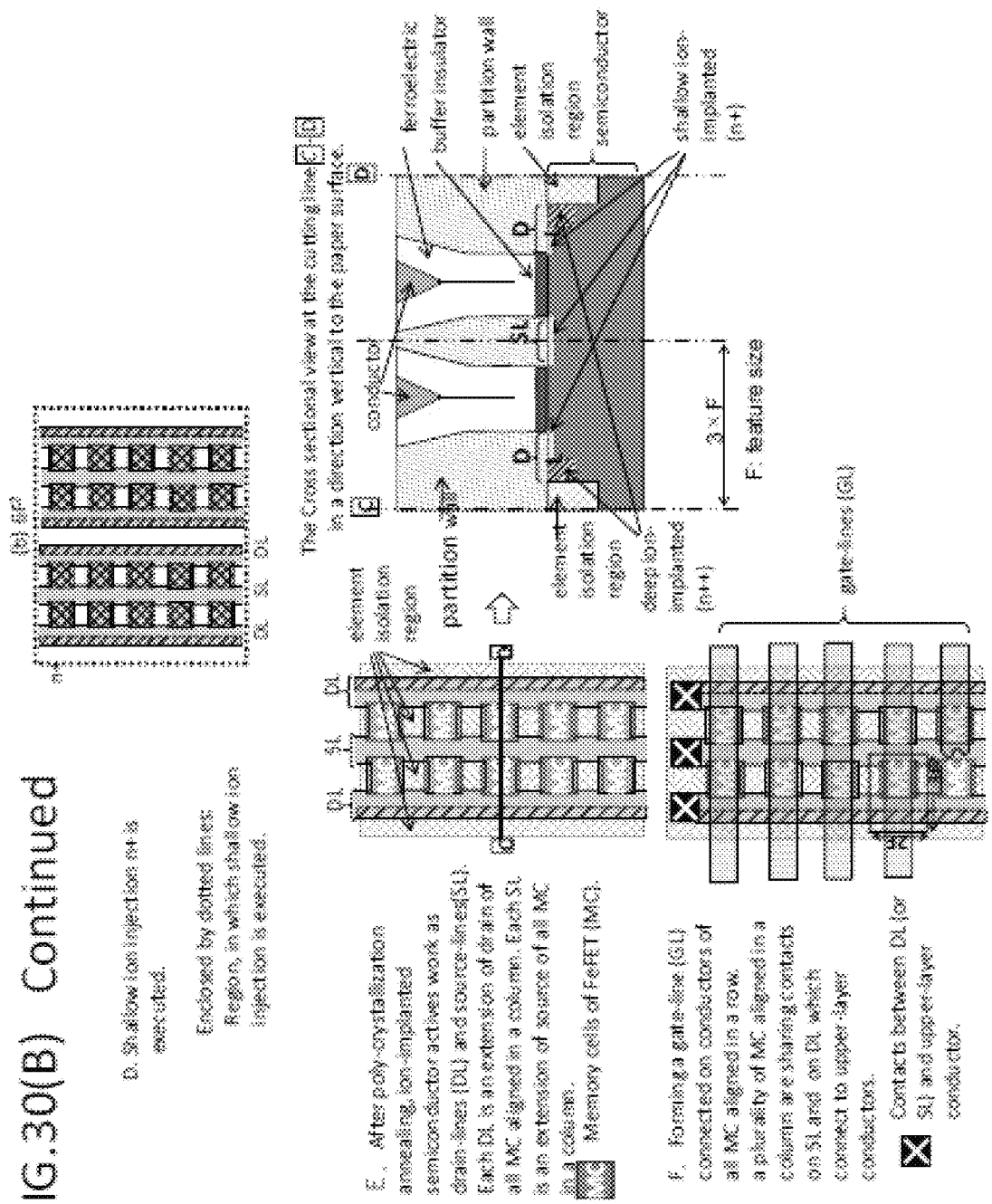

(a) $8F^2$

Ferroelectric NOR Memory Arrays

Well (substrate) potential is common in one memory array unit.

Drain Lines (DL) and Source Lines (SL)

Equivalent Circuit well: Well (sbstrate) terminal

Gate Lines (GL)

(b) $6F^2$

Drain Lines (DL) and Source Lines (SL)

Gate Lines (GL)

Examples of Operating Conditions for Ferroelectric NOR (a) 8F²

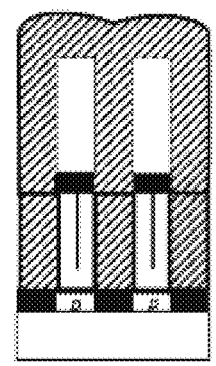

(14) After forming protruding structures at the projection position to the protruding structures as described in (5), insulator film, which becomes partition wall, is formed.

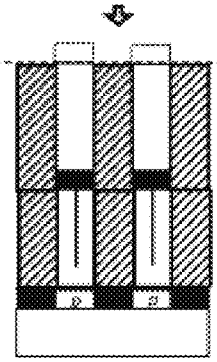

(15) Upper part od the protruding structures are exposed by planarization.

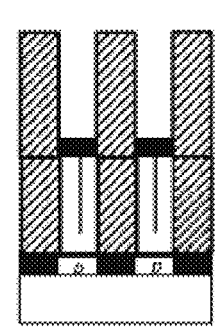

(16) Deep grooves are formed by selectively removing the protruding structures.

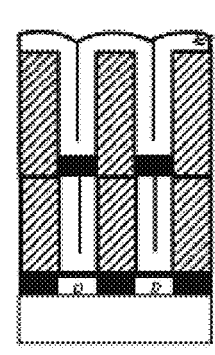

Ferroelectric Substance

(17) Ferroelectric film is formed in the deep grooves by good step coverage filming method.

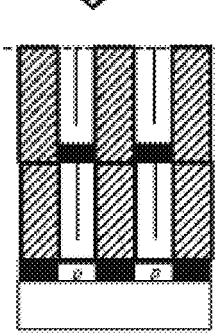

(18) Planarization is executed.

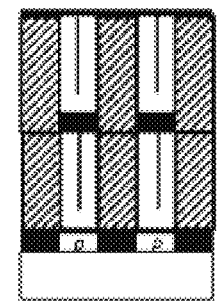

(19) Insulator film, which becomes buffer insulator, is formed.

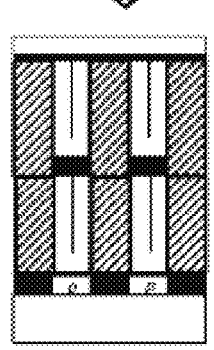

(20) Semiconductor film is formed.

| Element Isolation |
|---|
| Semiconductor |
| Element Isolation |
| Element Isolation |

Seen from above

(21) Element isolation region is formed at the projection position to the element isolation as described in (3).

FIG. 35(C)

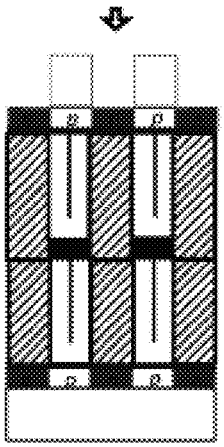

(22) Resists are formed at projection position to the protruding structures as described in (5), and n, p, n, p, ... region is formed by using the resists as a mold.

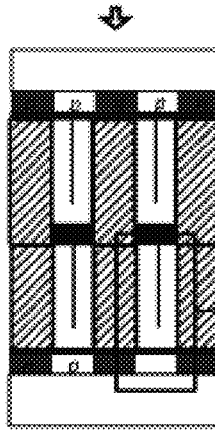

(23) Resists are removed, and insulator film is formed.

Unit of one Memory Cell

2F ← Gate Terminal

Source Terminal → ← Drain Terminal

Substrate Terminal

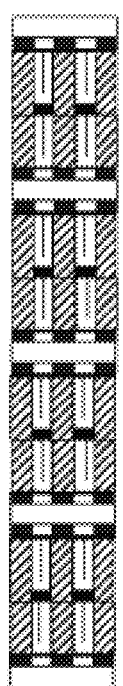

(24) Steps from (2) to (23) are repeated till arbitrary number. And, annealing is executed.

This figure shows the example in the case of 8 levels.

Height Direction

In-Plane Direction

SEMICONDUCTOR MEMORY ELEMENT, OTHER ELEMENTS, AND THEIR PRODUCTION METHODS

TECHNICAL FIELD

The present invention relates to a semiconductor memory element and other elements, and their production method. In more detail, the present invention relates to a fine and highly integrated semiconductor memory element and other elements using a structure-like memory substance etc. in the form with a width equal to or smaller than 100 nm, and high aspect ratio, which is a ratio of height to width, equal to or higher than double. The present invention also relates to their production method.

BACKGROUND ART

The semiconductor memory element using a functional material finally exhibits its peculiar function, when film thickness of the functional material is larger than several ten nanometers. For example, in the case of a ferroelectric gate transistor using a ferroelectric substance, which is one of the functional materials, memory window decreases and memory function of the element decreases, as a film thickness of the ferroelectric substance decreases (Patent Document 1). Also, the ferroelectric substance is a material that is hard to be etched, and then it is difficult to search a masking material, which has high etching selectivity and does not disappear till end of etching. Then, there is a limit for the memory window of the ferroelectric gate transistor to be broadened by thickening the film thickness of the ferroelectric substance before etching It is desirable for the slope of the sidewall of the ferroelectric substance after etching to be high. But, in reality, it is difficult for the slope to approach 90°. For example, in the trial production of the ferroelectric gate transistor by the etching, the following are clear from etching traces of an element's cross-sectional photograph of the Non-Patent Document 1. When a gate metal length is 100 nm, the length of the bottom is equal to or larger than 200 nm, which is approximately double the gate metal length. According to the Non-Patent Document 1, the coating of sidewalls by the ferroelectric substance is also necessary in order to recover etching damage of the ferroelectric substance's sidewalls. Then, in the case of the ferroelectric gate transistor, whose gate metal length is 100 nm, its occupation length on a semiconductor substrate cannot be smaller than 200 nm.

As another forming method which does not depend on the etching of the material, there is provided a method of embedding the material in the groove mold. However, in the conventional technology, there was a problem that it is difficult to reduce the width of the groove when the groove is processed deeply. For example, as the conventional technology for applying a groove structure to a semiconductor element, there are MEMS silicon deep digging, copper wiring by Damascene method, and replacement gate. In the production process of the MEMS etc., it is firstly requested that the deep groove is dug in the silicon or silicon oxide. As the method of directly digging the deep groove in the silicon or silicon-based material, the vertical anisotropic etching method including the Bosch method and the like are developed at a high degree (Non-Patent Document 2).

Additionally, the copper wiring by the Damascene method, which is used in a semiconductor circuit, is produced by the following groove's Damascene method. The groove is first dug into the silicon oxide, the copper material, which is a conductor, is embedded therein, and excess parts are shaved off using a planarization technique such as CMP (Patent Document 2). In both the Non-Patent Document 2 and the Patent Document 2, it is difficult to reduce the width of the groove when the dug groove is deepened, because the silicon material, which is bulk, is directly dug up. As characteristics of the production method common to the MEMS silicon deep digging and the copper wiring by the Damascene method, the protective film is a negative pattern of the groove in order to cut grooves after covering the area, which does not become the groove, with a protective film.

Further, there are structures called a Damascene gate, in which a gate conductor of the transistor is formed by the application of the Damascene method, or a replacement gate. In these cases, a dummy gate, which becomes the pattern of the gate conductor, is made of polysilicon seriously considering the consistency with the production process of the conventional polysilicon gate transistor, and is formed by the etching (Patent Document 3). Dry etching or wet etching using a halogen-based gas such as a fluorine-based gas or hydrogen bromide is used. Then, it is also difficult to reduce the width of the groove when the groove is deepened. In the application of the replacement gate, it is advantageous to narrow the width of the groove in accordance with miniaturization of the element, and there is no advantage of deepening the groove, thus a small aspect ratio is enough for the groove. In the production method of the ferroelectric gate transistor using the method of the replacement gate, for example, by the Non-Patent Document 3, the width of the groove before embedding the ferroelectric is 200 nm, and the depth of the groove is not clearly written but it is read from the figures of the Non-Patent Document 3 that the depth is about 50 nm.

PRIOR ART DOCUMENTS

Patent Documents

Patent Document 1 JP 5414036 B2
Patent Document 2 JP 2008-41783 A
Patent Document 3 JP 2004-31753 A Non-Patent Documents Non-Patent Document 1 Le Van Hai, et al., Japanese Journal of Applied Physics 54, 088004(2015).
Non-Patent Document 2 Denso Technical Review Vol. 6 No. 2 2001, J. Ohara, et al., pp. 72-77.
Non-Patent Document 3 Fengyan Zhang, et al., Japanese Journal of Applied Physics 40, pp. L635-L637 (2001).

DISCLOSURE OF THE INVENTION

Problems to be Solved by the Invention

The present invention aims to provide a semiconductor memory element and other elements using a high aspect ratio memory substance, in which an effective thickness is not restrict by an in-plane scaling, width is equal to or smaller than 100 nm and height is larger than double of the width, and their production method.

Solution for Solving the Problems

The invention is a semiconductor memory element having a laminated structure, in which a semiconductor, a memory substance and a conductor are laminated, and the memory substance having two or more stable states, which are distinguished from each other, and selectively selecting one of the stable states, wherein one of the facing surfaces of the memory substance contacts with the semiconductor, another of the facing surfaces contacts with the conductor, at least one side-surface of the memory substance is not parallel with the facing surfaces of the memory substance that contacts with and is surrounded by a partition wall, an area of a cross-section of the memory substance parallel with the semiconductor is narrowest at the one facing surface in contact with the semiconductor, the area of the cross-section is the same or wider as the area of the cross-section extends from the semiconductor, a minimum width of the cross-section is equal to or smaller than 100 nm, and a shortest distance between the conductor and the semiconductor is equal to or larger than double of the minimum width of the cross section.

The partition wall includes a lamination of two or more materials having different etching rates.

The memory substance includes a lamination of a buffer insulator and a ferroelectric substance, the ferroelectric substance does not directly contact the semiconductor, and the buffer insulator has a higher dielectric constant than a dielectric constant of the partition wall.

The semiconductor includes a transistor having a gate terminal, a source terminal, a drain terminal and a substrate terminal, the gate terminal is connected to the conductor, a voltage applied between the gate terminal and the substrate terminal is equal to a voltage applied to a lamination comprising the memory substance and the semiconductor, the source terminal is connected to the source region, the drain terminal is connected to the drain region, the source region and the drain region are portions of the semiconductor not overlapping each other, and the transistor sandwiches a surface at which the memory substance contacts with the semiconductor, and bounds with the memory substance on both sides.

A production method is provided that includes forming a protruding structure erected on a substrate, the protruding structure having a width that is equal to or smaller than 100 nm, the protruding structure having a height that is equal to or larger than double of the width;

covering the protruding structure with a partition wall, shaving the protruding structure covered with the partition wall in a direction from a top of the protruding structure to the substrate, and selectively removing the protruding structure removed so that to form a groove, having a width that is equal to or smaller than 100 nm.

The protruding structure may consist of organic substances, the partition wall may consist of inorganic substances, and the protruding structure is selectively removed by an oxygen plasma etching.

The protruding structure may consist of a lamination of two or more layers, and the selectively removing the protruding structure includes selectively removing the two or more layers except for the bottom layer.

The substrate may consist of a lamination of two or more layers.

The partition wall may consist of a lamination of two or more materials with different etching rates.

A slope may be made at an opening of the groove such that the opening becomes wider toward the top from the substrate.

An electrical conductor may be placed in the groove obtained by the method above.

A production method of optical wiring may be provided, wherein the partition wall is a light blocking material, and a light transmitting material is placed in the obtained groove obtained by the method above.

A memory substance may be placed in the groove obtained by the method above.

A production method of ferroelectric gate transistor may be provided in which at least the surface of the substrate is a semiconductor, the source region and the drain region are formed in self-alignment to the protruding structure in the semiconductor before forming the partition wall, and a ferroelectric material is place in the groove obtained by the method above.

The memory substance may include a ferroelectric film formed by a metal organic chemical vapor deposition.

A production method may be provided of obtaining an electronic circuit consisting of two or more elements obtained by providing two or more widths of a protruding structure, and memory substance films are simultaneously formed in two or more grooves having different widths and obtained by the method above; and then the height of the memory substance filled in the groove from the substance is controlled by changing the widths of the grooves and the strength of the memory function of each element can be variable.

A production method may be provided of obtaining a ferroelectric gate transistor, in which a protruding structure is formed on a semiconductor, a source region and a drain region are formed in self-alignment to the protruding structure, a partition wall is formed so that it covers a top of the semiconductor and the protruding structure, the protruding structure and its surrounding partition wall are shaved in the direction from the top to a substrate, a groove is formed by selectively removing the protruding structure so that the height of the partition wall, which is the wall surface of the groove, is equal to or lower than the partition wall at a position away from the center of the groove by a distance corresponding to the width of the groove, and a ferroelectric material is placed in the groove.

A memory cell array may be provided including memory cells, each of corresponds to one semiconductor memory element, being arranged regularly in two rows and two columns or more in a substrate plane; wherein the substrate terminals of the memory cells belonging to the common memory cell array are at the same potential; the memory cell array includes gate lines electrically short-circuiting the gate terminals of two or more memory cells arranged in a row in the horizontal direction, drain lines electrically short-circuiting the drain terminals of two or more memory cells aligned in a vertical direction, and source lines electrically short-circuiting the source terminals of two or more memory cells aligned in a vertical direction; the drain lines are parallel to the source lines; the gate lines are orthogonal to the drain lines and the source lines; and a short circuit between the drain terminals for constituting the drain line and a short circuit between the source terminals for constituting the source line are performed by connecting the semiconductor active regions corresponding to the drain region and the source region of each memory cell without passing through a contact hole.

In the above memory cell array, the memory cells are paired for every two adjacent rows in the vertical direction, one source line is shared among each pair, drain lines are provided on both sides across the source line, and two rows of memory cells have a symmetrical arrangement with respect to the source line.

A memory cell array is provided that includes memory cells, each of which corresponds to one semiconductor memory element, being arranged regularly in two rows and two columns or more in the substrate plane, and which is stacked two or more layers in the direction perpendicular to the substrate, that is, in the height direction; wherein the two layers closest to each other at the top and bottom are paired with each other in the height direction, upper and lower memory cells confront each other symmetrically with a conductor interposed there between in each pair, and the upper and lower opposing memory cells share conductors.

The memory cell array described in the sentence before three paragraphs is defined as one layer unit, and two or more layer units are stacked, wherein the two layer units closest to each other in the height direction are paired with each other, the upper and lower memory cells in each pair face each other face-symmetrically across a gate line, and memory cells, which face each other vertically, share the gate line.

In the memory cell array described immediately above, the memory cells are paired for every two adjacent rows in the vertical direction, one source line is shared among each pair, drain lines are provided on both sides across the source line, and two rows of memory cells have a symmetrical arrangement with respect to the source line.

Effects of the Invention

In the present invention, a protruding structure made of a material having a high etching rate is covered with a partition wall of a material having a relatively low etching rate, is anisotropically cut from the upper side to expose the head portion of the protruding structure, and is selectively removed by etching. Then a high aspect groove is left in the partition wall. By selectively etching the protruding structure, the bottom surface of the exposed groove can have less damage and can accept the interface level by appropriately adjusting the etching conditions. A functional material is deposited and buried in this groove by a film forming method with good step coverage, and it is used for a semiconductor memory element.

According to the present invention, it is possible to provide the functional material having the high aspect shape in the partition wall on the substrate, and it is effective as a production process of an electronic device. For example, by using an insulator as the partition wall and embedding an electrical conductor in the deep groove formed according to the present invention, an electric wiring can be produced.

Or, by using a light-impermeable material as the partition wall and embedding a light transmitting material in the deep groove formed according to the present invention, an optical wiring can be produced.

Further, by using a semiconductor as the substrate, using an insulator as the partition wall, and embedding a functional material having a nonvolatile memory function such as ferroelectric or magnetic material and an electrode conductor in the deep groove formed according to the present invention, a data nonvolatile transistor can be produced.

The present invention provides a ferroelectric gate transistor having a very high aspect shape and less etching damage as compared with the conventional method of forming a ferroelectric by etching.

Etching is roughly classified into three types: chemical etching by chemical reaction, physical etching by abrasive impact of accelerated etching species, or etching by mixing of both components. In the physical etching, the substance scattered by the etching reattaches to the sidewall immediately above and shields the etching species, so that the cross sectional shape after completion of etching tends to be a trapezoidal shape with a lower base greater than the upper base. This tendency becomes more pronounced as the object to be etched is thicker. Further, when the material becomes harder to be etched, the chemical reactivity becomes less. Then, since the physical etching component is indispensable in the etching process, the cross-section after the etching tends to be trapezoidal.

According to the present invention, it is different from the production method of the conventional planar type FeFET, and it is not necessary to perform three processes of gate stack etching in a self-aligned manner, ion injection and high temperature annealing by treating the conductor and the ferroelectric as one in producing FeFET. Therefore, it is possible to form and mold the conductor film after performing high-temperature annealing for ferroelectric polycrystallization before forming the conductor film. The high temperature annealing temperature is, for example, about 800° C. when a bismuth layered perovskite type ferroelectric substance such as $SrBi_2Ta_2O_9$ or $Ca_xSr_{1-x}Bi_2Ta_2O_9$ is used, and the metals, which can withstand this high temperature and retain the properties of the conductor, are limited to poor reactive metals like Pt, Ir and other precious metals. Precious metals are expensive and the price is unstable. In addition, chemical stability, which is the characteristic of Pt and Ir, is in other words poor reactivity. Because of poor chemical reactivity, molding has to be performed by etching mainly by physical etching rather than reactive etching, and it also has a disadvantage that shaping accuracy is not good.

According to the present invention, it is unnecessary to require a conductor having high heat resistance, and then it is possible to select an inexpensive conductor material as an electrode rather than an expensive noble metal material. An inexpensive conductive material is, for example, aluminum, titanium, hafnium, tantalum, silicon, or a nitride or compound thereof, and having conductivity. Since they have higher chemical reactivity as compared with Pt and Ir, shaping accuracy is better when forming by etching, and then it is advantageous for microfabrication.

According to the present invention, it is possible to increase the effective thickness (H) of the ferroelectric independently of reducing the distance between the source and the drain of the ferroelectric gate transistor, that is, the channel length (L). H is the height occupied by the ferroelectric positioned between the conductor and the buffer insulator.

According to the present invention, H can secure at least twice the value of L or more (H≥2 L). Therefore, according to the present invention, it is possible to produce a ferroelectric gate transistor, in which L is smaller than 100 nm, memory window is large and multi-level memory is possible. In general, in order to secure a large memory window of the FeFET, it is necessary to make the ratio of the voltage applied to the ferroelectric material as large as possible among the voltages applied between the gate and the substrate of the FeFET. The voltage $V_{ALL}$ applied between the gate and the substrate of the FeFET is distributed to the ferroelectric (suffix F), the buffer insulator (subscript I) and the semiconductor (suffix S). MFIS is simply regarded as a series connection of capacitances. Since the accumulated charge density Q is common, the equation $Q=C_F \times V_F = C_I \times V_I = Q_S$ is established. $C_F$ is the electrostatic capacitance per unit area of the ferroelectric, $V_F$ is the voltage distributed to the ferroelectric, $C_I$ is the capacitance per unit area of the buffer insulator, $V_I$ is the voltage distributed to the buffer insulator, and $Q_S$ is the surface charge density of a semiconductor. Since the surface potential of the semiconductor is defined as $\Psi_S$, $V_{ALL}-\Psi_S=V_F\times(1+C_F/C_I)$ is established, because $V_{ALL}=V_F+V_I+\Psi_S$. $\Psi_S$ is specified by the impurity concentration of the semiconductor and $Q_S$. Therefore, considering the case, where $V_{ALL}$ and $\Psi_S$ are nearly constant, it is better to make $C_F/C_I$ as small as possible in order to increase $V_F$ for the purpose of widely securing the memory window of the FeFET. In order to reduce $C_F/C_I$, it is necessary to increase $C_I$ or reduce $C_F$. In order to increase the $C_I$, it is effective to make the buffer insulator a high dielectric material and make it thinner. In order to reduce $C_F$, it is effective to make the ferroelectric material to have a low relative dielectric constant $\varepsilon_F$ and make it thick.

However, in reality, $\varepsilon_F$ of the ferroelectric is often high, and in that case it is no other than to increase the effective thickness H of the ferroelectric. For example, $SrBi_2Ta_2O_9$, which is a bismuth layered perovskite type ferroelectric material, has a relative permittivity of 180 (Reference: S. Sakai, et al., Japanese Journal of Applied Physics, Vol. 43 (2004) pp. 7876-7878). In the production process of the conventional planar type FeFET, the ferroelectric material was formed by etching, so that the cross section became a trapezoidal shape. The metal gate length corresponding to the upper base of the trapezoid was shorter than the distance between the source and the drain corresponding to the lower base, that is, the channel length (L). Therefore, there was an undesirable correlation that L increased as the effective thickness (H) of the ferroelectric was increased with respect to a certain metal gate length.

According to the present invention, this problem is solved and it is possible to increase H independently from reducing L.

According to the present invention, in addition to eliminating the correlation between H and L as described above, the FeFET can be produced without etching a ferroelectric substance, which is often a hardly etched material, and then the advantage of being able to increase H can be obtained. Many of the ferroelectrics are difficult to be etched, that is, they are poor in chemical reactivity and slow in etching rate. Therefore, when etching, a physical etching element is indispensable. Of course, the cross section after the etching tends to be a trapezoidal shape, and the etching selectivity between the mask material and the ferroelectric material cannot be made very large. The etching selectivity cannot be increased regardless of whether the mask material is an organic resist or an inorganic material such as metal or silicon or oxides or nitrides thereof.

Therefore, in order to complete the etching of the ferroelectric before the mask disappears, the film thickness of the ferroelectric cannot be made very large. For example, in the case where $Ca_xSr_{1-x}Bi_2Ta_2O_9$, which is a bismuth layered perovskite type ferroelectric having a film thickness of 150 nm, is etched, the sectional shape is desirably a rectangle, but in reality it is trapezoidal. And, when etching starting from the upper side of 140 nm to 190 nm is ended, the lower side is more than twice as large as each upper side. Since Pt with an initial film thickness of 150 nm seems to be thinner than 150 nm after completing the etching of $Ca_xSr_{1-x}Bi_2Ta_2O_9$ with a film thickness of 150 nm, it can be seen that the etching mask disappears during etching (Reference: L. V. Hai, et al., Semiconductor Science and Technology, Vol. 30 (2015) 015024 (7 pp).). Therefore, as written in the subsequent report (Le Van Hai, et al., Japanese Journal of Applied Physics 54, 088004 (2015).), in the case of processing the layer of $Pt/Ca_xSr_{1-x}Bi_2Ta_2O_9$ by etching, it is considered that the combination of the minimum value 100 nm of the upper side of $Ca_xSr_{1-x}Bi_2Ta_2O_9$ and the maximum value 190 nm of the film thickness at that time is close to the processing limit by etching. As a result, in the production method of the conventional planar type FeFET, there was a drawback that H cannot be made thick and the memory window is suppressed. But, according to the present invention, this problem is solved.

According to the present invention, by starting grooves having different widths and having grooves of different widths coexist on the same substrate, transistors, whose ferroelectrics have different effective thicknesses H, can be arranged on the same substrate. Ferroelectric gate transistors having different H can be produced by selecting an appropriate controlled film thickness on the plane according to the width of the deep groove. For a groove having a small width, the ferroelectric substance is filled up to the top, and then a nonvolatile memory element having a large H is formed. For a groove having a large width, the ferroelectric thin film existing only on the bottom surface and the wall surface acts as a high dielectric, and then a device having a small H and having no memory function is formed.

Further, according to the present invention, it is possible to form deep grooves not only on the gate of the transistor but also on the source and the drain, and the functional material can be embedded in them. According to the present invention, the functional material is not subjected to etching damage. Then, even if the width of the functional material in the substrate plane is reduced to 100 nm or less, the effective thickness can be more than twice the width of the effective material. Because the fine highly integrated in the substrate surface can be achieved without sacrificing the performance of the functional material and the effective thickness is not reduced, the performance of the device produced according to the present invention is hardly restricted by the scaling.

According to the present invention, it is possible to provide the FeFET, which secures a wide memory window without restriction of channel length scaling, a conventional silicon CMOS process and a producing apparatus can be shared until just before the process of ferroelectric film formation, and there is no concern about contamination of the device due to scattering of the ferroelectric material because it is unnecessary to etch the ferroelectric material. Therefore, compared with the conventional planar type FeFET, capital investment in mass production can be reduced in the FeFET producing according to the present invention. Because etching of the ferroelectric is unnecessary, it is possible to reduce the risk of impairing important performance derived from the ferroelectric such as data retention characteristics of the FeFET and data rewrite resistance due to etching damage. By eliminating etching damage, which is common to many other functional materials not limited to ferroelectrics, devices can be formed without impairing the inherent performance of the functional material.

BRIEF DESCRIPTION OF THE DRAWINGS

FIG. 1(a) shows the case of a flat surface, FIG. 1(b) shows a case of a wave surface, and FIG. 1(c) shows the case where hole is contained therein.

FIG. 6(a) shows a schematic view. FIGS. 6(b), 6(c), and 6(d) show sectional SEM photograph, its schematic view and measured data of drain current-gate voltage (Id-Vg) characteristics of each elements, in which L is commonly about 100 nm and H is different. FIG. 6(b) is in the case of H=370 nm, FIG. 6(c) is in the case of H=420 nm, and FIG. 6(d) is in the case of H=540 nm

FIGS. 30(a) and 30(b) show views describing shapes of a memory cell array according to one or more embodiments. 30(a) shows the case where the occupation area of one memory cell is $8F^2$, and 30(b) shows the case of $6F^2$.

FIG. 31(a) shows the case where the occupation area of one memory cell is $8F^2$, and FIG. 31(b) shows the case of $6F^2$.

FIG. 32(a) shows the case where the occupation area of one memory cell is $8F^2$, and FIG. 32(b) shows the case of $6F^2$.

FIG. 33(a) shows the case where the occupation area of one memory cell is $8F^2$, and FIG. 33 (b) shows the case of $6F^2$.

FIGS. 35(a)-35(c) show views indicating an overview of a production process of a multilayer memory cell array, in which the occupation area of one memory cell is $4F^2$, according to the present invention.

Figure 1A:
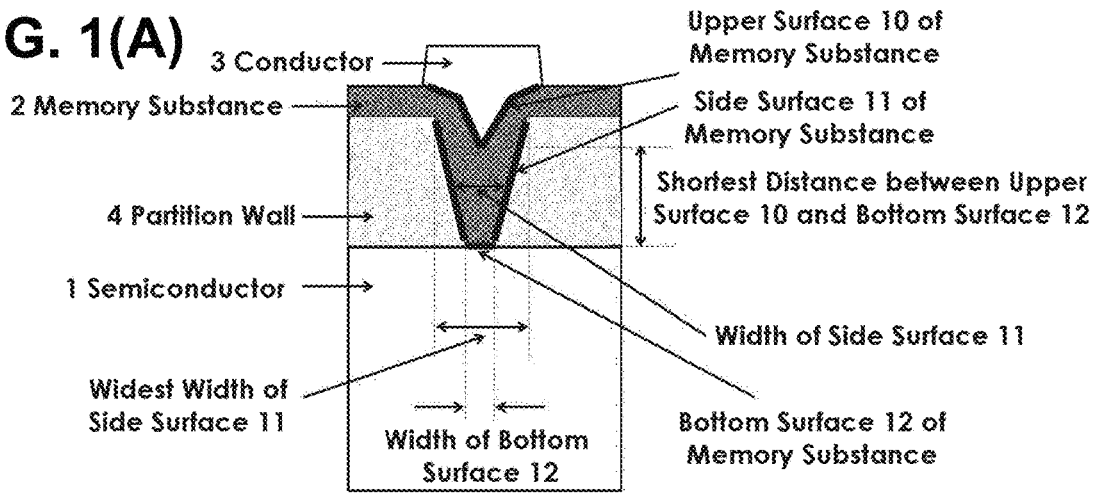
FIGS. 1(a)-1(c) show sectional views of a semiconductor memory element according to the embodiment of the present invention.

DESCRIPTION OF REFERENCE NUMERALS AND SIGNS 1 substrate (semiconductor substrate)
2 memory substance 3 conductor
4 partition wall
10 upper surface
11 side-surface
12 lower surface

DESCRIPTION OF EMBODIMENTS

The memory substance is a solid having a memory function in whole or in part. In other words, the memory substance may be a solid composed of a single material having a memory function, or may be a solid composed of a lamination of a material layer having a memory function and a layer of a material having no memory function. An example of a memory substance is a solid composed of two layers of ferroelectric and paraelectric.

Figure 1B:
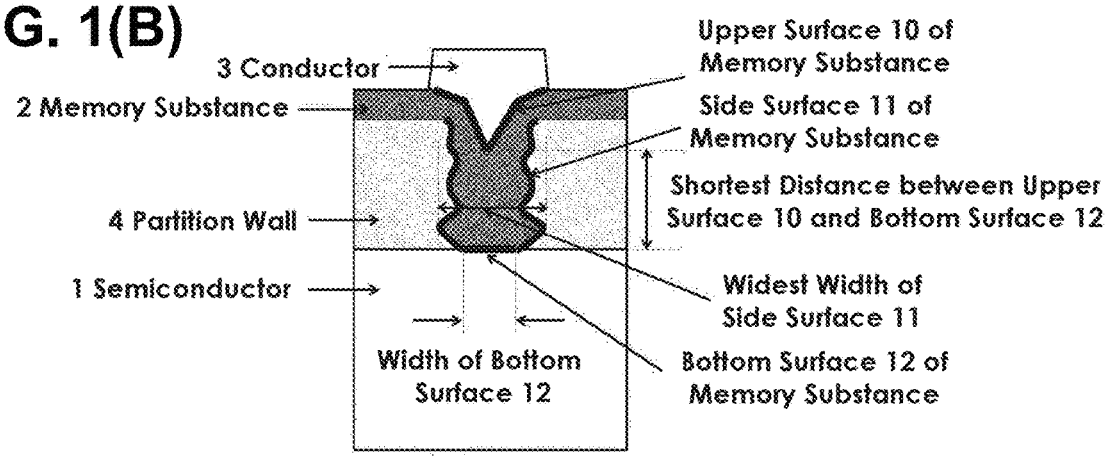
Figure 1C:
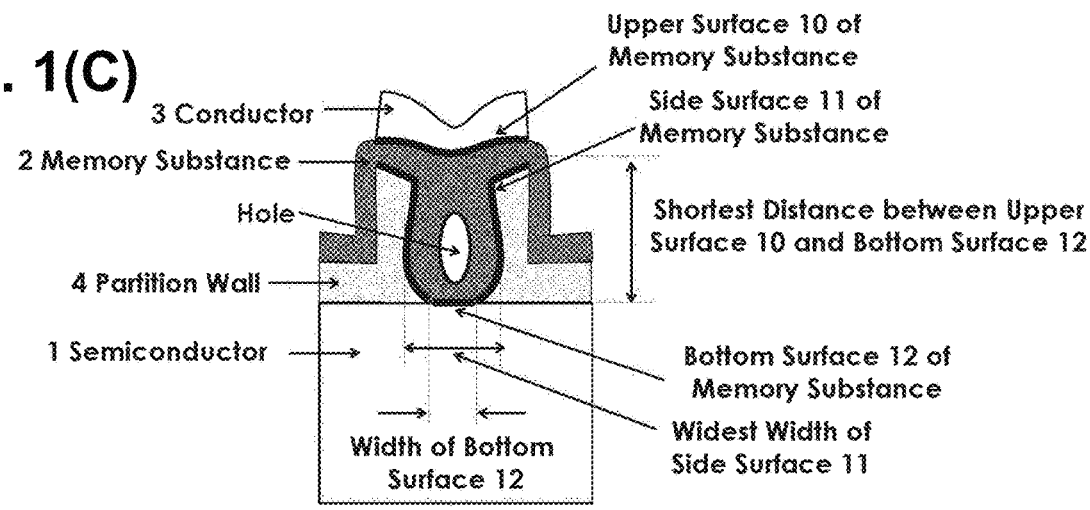

Embodiments of the present invention are semiconductor memory elements having sectional structures shown in FIGS. 1(a), 1(b) and 1(c). In other words, the semiconductor has a laminated structure, in which a memory substance 2 and a conductor 3 are laminated on a semiconductor substrate 1, and surrounded so that a bottom surface 12 of the memory substance 2 is in contact with the semiconductor substrate 1, an upper surface 10 of the memory substrate 2 is in contact with the conductor 3, and a side-surface 11 of the memory substance 2 is in contact with a partition wall 4. The conductor 3 and the semiconductor are respectively used as a gate electrode and a substrate electrode. When the memory substance 2 consists of a lamination, at least a part of the memory substance 2 in contact with the conductor 3 is not a conductor, and at least a part of the memory substance 2 in contact with the semiconductor is not a semiconductor.

The semiconductor memory element according to the present invention has three characteristics in its shape. Three characteristics are: (1) the width of the bottom surface 12 of the memory substance is equal to or smaller than 100 nm; (2) the shortest distance between the upper surface 10 and the bottom surface 12 of the memory substance 2 is equal to or larger than double the width of the bottom surface 12; and (3) the width of the side-surface 11 of the memory substance 2 is the same as the width of the bottom surface 12 at any position above the bottom surface 12, or is the widest at the position above the bottom surface 12.

The side-surface 11 of the memory substance 2 may be flat as shown in FIG. 1(a), it may be a wave surface as shown in FIG. 1(b), or it may be a loose curved surface as shown in FIG. 1(c). Also, the memory substance 2 may be densely packed as shown in FIGS. 1(a) and 1(b), or it may contain a hole as shown in FIG. 1(c).

Figure 2:
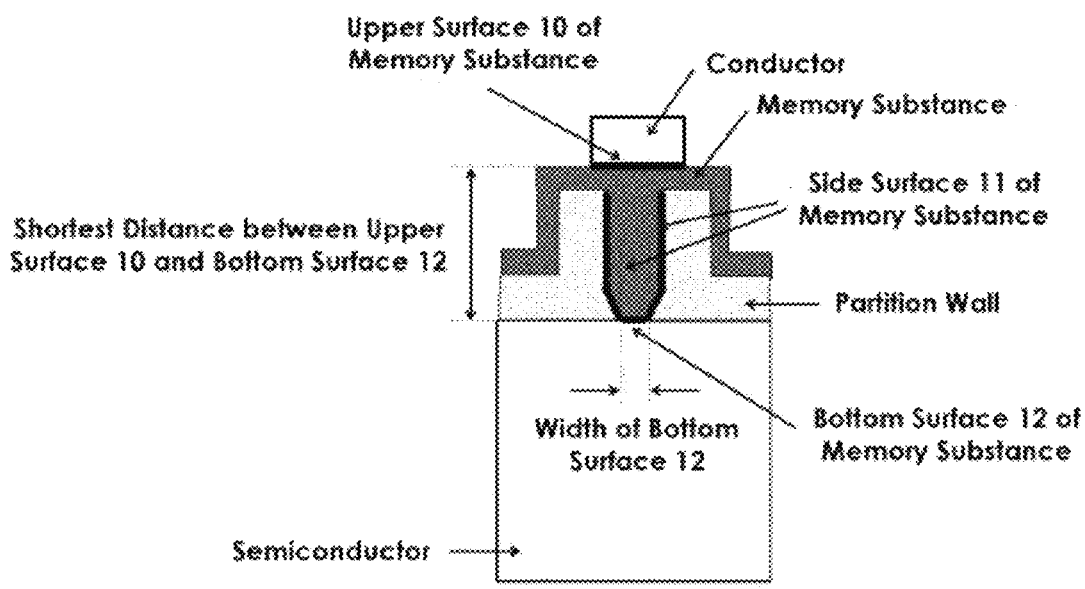
FIG. 2 shows a sectional view of a semiconductor memory element according to another embodiment of the present invention.
Figure 3:
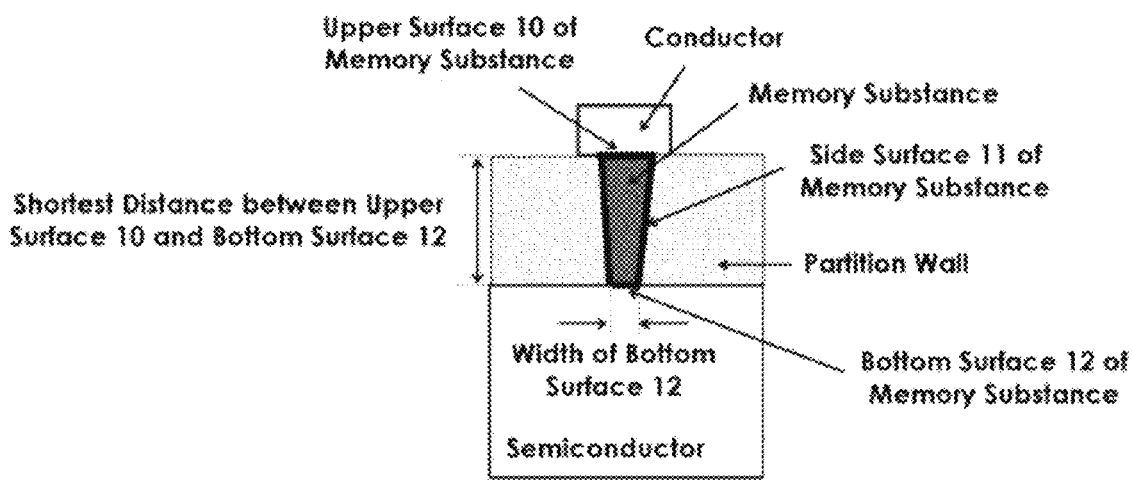
FIG. 3 shows a sectional view of a semiconductor memory element according to another embodiment of the present invention.
Figure 4:
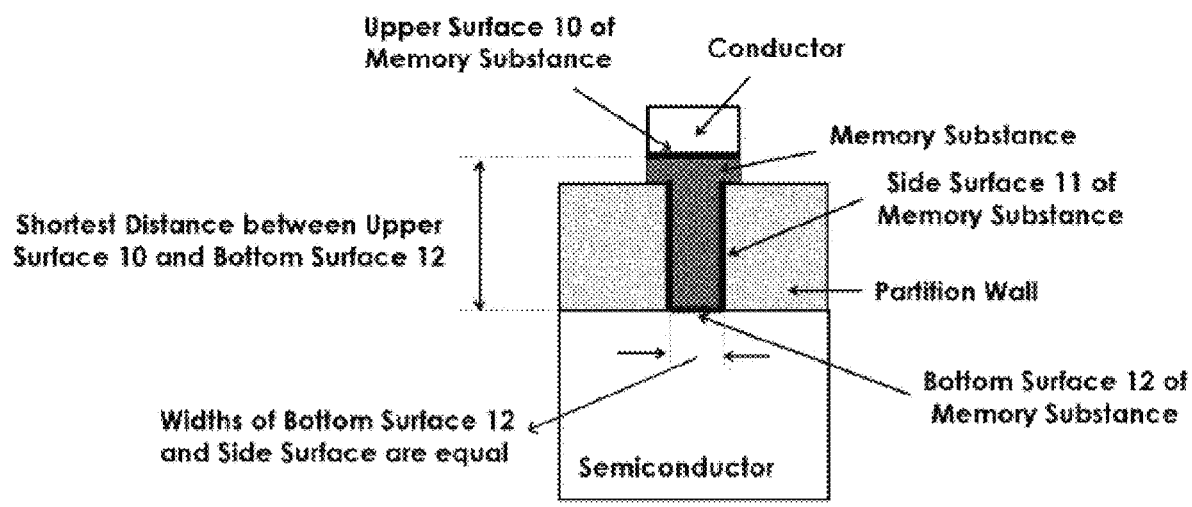
FIG. 4 shows a sectional view of a semiconductor memory element according to another embodiment of the present invention. The part not surrounded by the partition wall is removed leaving a part only under the conductor.

Parts of the memory substance 2, which are not surrounded by the partition wall 4, may exist outside the partition wall 4 as shown in FIGS. 1(a), 1(b), 1(c) and FIG. 2, all of them may be removed as shown in FIG. 3, or they may be removed leaving a part only under the conductor 3 as shown in FIG. 4. The shape as shown in FIG. 3 is realized, for example, by cutting or polishing the upper surface 10 of the memory substance 2 to the same height as the upper surface of the partition wall 4, and then forming the conductor 3. The shape as shown in FIG. 4 is realized, for example, by forming a film of the conductor 3 on the memory substance 2, then forming it by lithography and etching and at the same time forming the memory substance 2 in a self-aligning manner.

In the embodiments of the present invention illustrated in FIGS. 1(a), 1(b), 1(c), 2, 3, 4, in any case, the width of the side-surface 11 of the memory substance 2 is same as the width of the bottom surface 12 in any position on the bottom surface 12, or it is the widest at a position above the bottom surface 12 except the bottom surface 12. This cross-sectional shape is specific to a production method, in which a groove with a high aspect ratio is firstly prepared and the memory substance 2 is embedded in the groove. In a method different from the present invention, for example, a method of directly etching the memory substance 2 to a high aspect, the width of the side-surface of the memory substance 2 is the widest at the bottom surface 12 in contact with the semiconductor substrate 1. It is different from the present invention.

Figure 5:
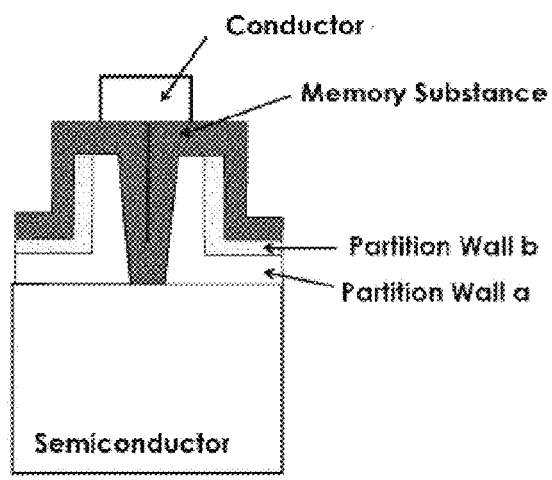
FIG. 5 shows a sectional view of a semiconductor memory element according to another embodiment of the present invention. It shows the case where the partition wall is two layers.

In a semiconductor memory element according to one embodiment of the present invention, the partition wall may be a lamination of two or more layers. For example, a case where the partition walls are two layers is shown in FIG. 5. Etching rates are different between the partition wall a directly contacting the semiconductor substrate and the memory substance, and the partition wall b located on the outer side in relation to the semiconductor substrate. In the case where it is desired to use the partition wall a having a higher etching rate than the partition wall b, for example, silicon oxide is used as the partition wall a and silicon nitride, titanium, titanium oxide, titanium nitride, aluminum oxide, aluminum nitride or the like is used as the partition wall b. And, the etching is performed under the condition that the silicon oxide of the partition wall a is selectively etched quickly. For example, reactive ion etching (RIE) using a fluorine-based gas such as $CF_4$ as a process gas corresponds to this.

One embodiment of the present invention may also be, for example, a ferroelectric gate transistor (FeFET) as shown in FIGS. 6(a)-6(d). The partition wall may be a single layer as shown in FIG. 1, or may be two or more layers as shown in FIG. 2. In FIGS. 6(a)-6(d), the partition wall is three layers. If a lamination of two or more materials with the different etching rates is used for the partition walls, it is possible to form a slope such that the opening of the deep groove is opened as is extends upward by the etching.

Figure 6A:
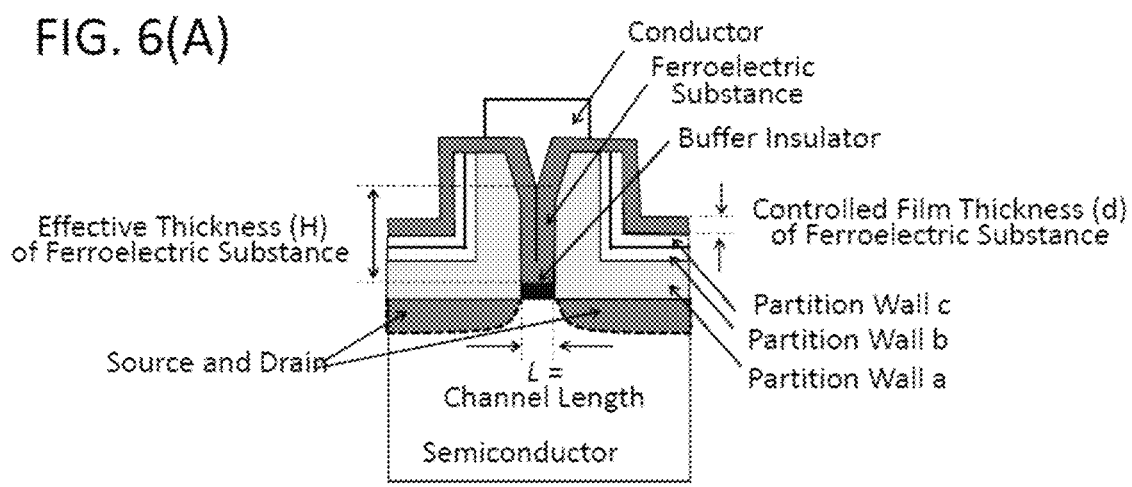
FIGS. 6(a)-6(d) show sectional views of a semiconductor memory element according to another embodiment of the present invention. It is ferroelectric gate transistor (FeFET).

FIG. 6(a) shows an FeFET having a laminated structure called a metal-ferroelectric-insulator-semiconductor MFIS structure. The source and drain regions are formed on the semiconductor substrate in a self-aligning manner by ion injection method or the like based on the shape of the buffer insulator. The channel length of the FeFET of FIG. 6, i.e., the distance (L) between the source region and the drain region, is equal to the length of the bottom of the buffer insulator. The effective thickness (H) of the ferroelectric of the FeFET of FIGS. 6(a)-6(d) is the distance from the upper surface of the buffer insulator to the lower surface of the conductor. Therefore, the effective thickness (H) of the ferroelectric of the FeFET according to one embodiment of the present invention depends on the depth of the deep groove, and does not depend on the controlled film thickness (d) of the ferroelectric. At this point, the controlled film thickness refers to the film thickness when formed on a horizontal surface without irregularities. Simultaneously with, immediately before or immediately after the actual sample of the FeFET, a film is formed under the same conditions as a film thickness monitor on a horizontal plane having no irregularities, for example, a patternless silicon crystal substrate. By measuring the film thickness by a non-destructive measurement method such as an ellipsometer or a destructive measurement method such as sectional SEM image observation, it is possible to know the accurate film thickness formed on the actual sample without destroying the actual sample. It is relatively easy to grasp the film thickness on such a horizontal plane. The deposition speed on the vertical direction, for example, on the inner wall of the deep groove is generally slower than that on the horizontal plane.

Prior to fabrication of the FeFET according to one embodiment of the present invention, ferroelectric's two information about the film forming speed $V_a$ (nm/sec) on the horizontal plane, and about the film forming speed $V_b$ (nm/sec) on the inner wall of the deep groove, and the width L (nm) of the deep groove are ascertained in advance by conducting test film formation using a predetermined film forming method and film formation conditions. For example, the relationship between $V_a$ and $V_b$ is expressed as $V_b=k \times V_a$. The film forming speed on the inner wall of the deep groove is generally slower than that on the horizontal plane, $0<k \leq 1$. By assuming that the film formation time t (sec) required to embed the ferroelectric thin film in the deep groove without gaps, the relationship of $2 \times V_b \times t \geq L$, that is, $2 \times k \times V_a \times t \geq L$ is established. Even if it is not limited to ferroelectrics but other materials, these relational expressions are established. In other words, the film formation time t (sec) for burying the ferroelectric thin film in the deep groove with no gap is $t \geq L/(2 \times k \times V_a)$, and at that time, the controlled film thickness d on the horizontal plane that can be confirmed by using the film thickness monitor sample is $d=V_a \times t \geq L/(2 \times k)$.

In a semiconductor memory element according to one embodiment of the present invention, a film of a memory substance embedded in a deep groove may be formed by a metal organic chemical vapor deposition (MOCVD) method. The MOCVD method has a characteristic with good step coverage. For example, in the production process of the FeFET shown in FIG. 3, by forming the ferroelectric material film by MOCVD method under appropriate film formation conditions, the ratio of the film forming speed on the inner wall surface and the horizontal surface of the deep groove, that is, $k=V_b/V_a$ can be brought close to 1. In order to efficiently embed a memory substance in the deep groove with high aspect ratio, it is better that k is larger and closer to 1. For example, when the ferroelectric is embedded in a deep groove with L=80 nm, if k=1 and d is at least 40 nm, the ferroelectric thin film can be embedded into the bottom of the deep groove without gaps.

Figure 6B:
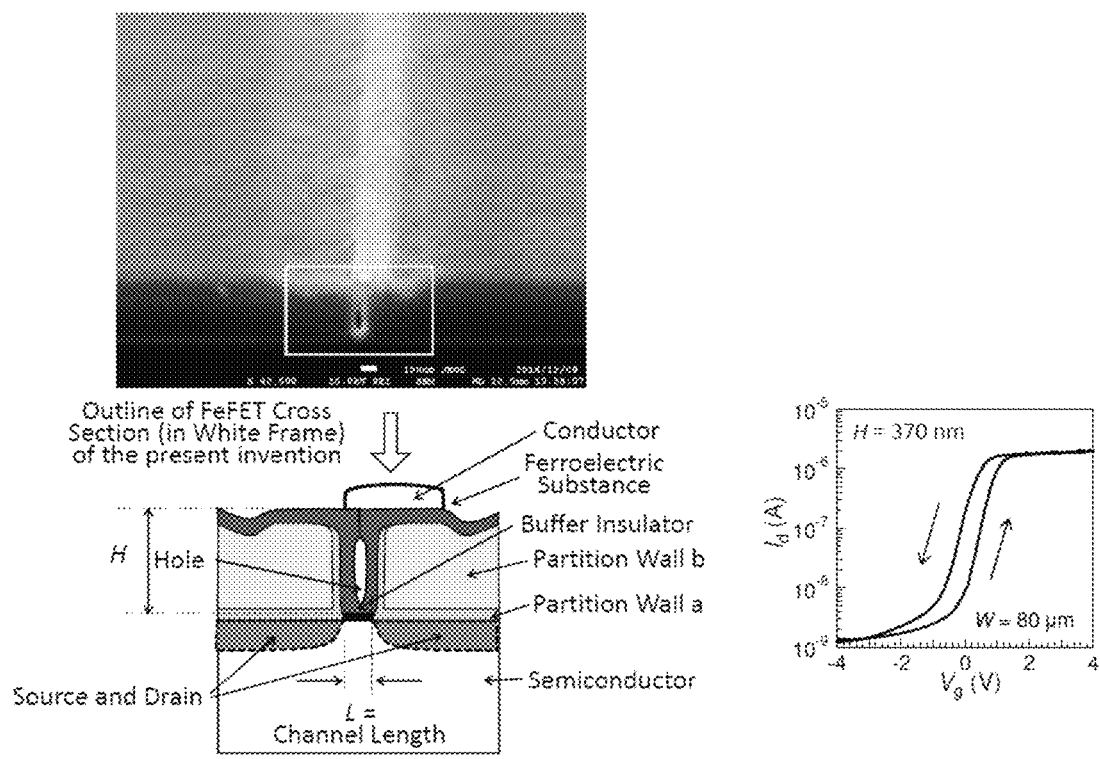
Figure 6C:
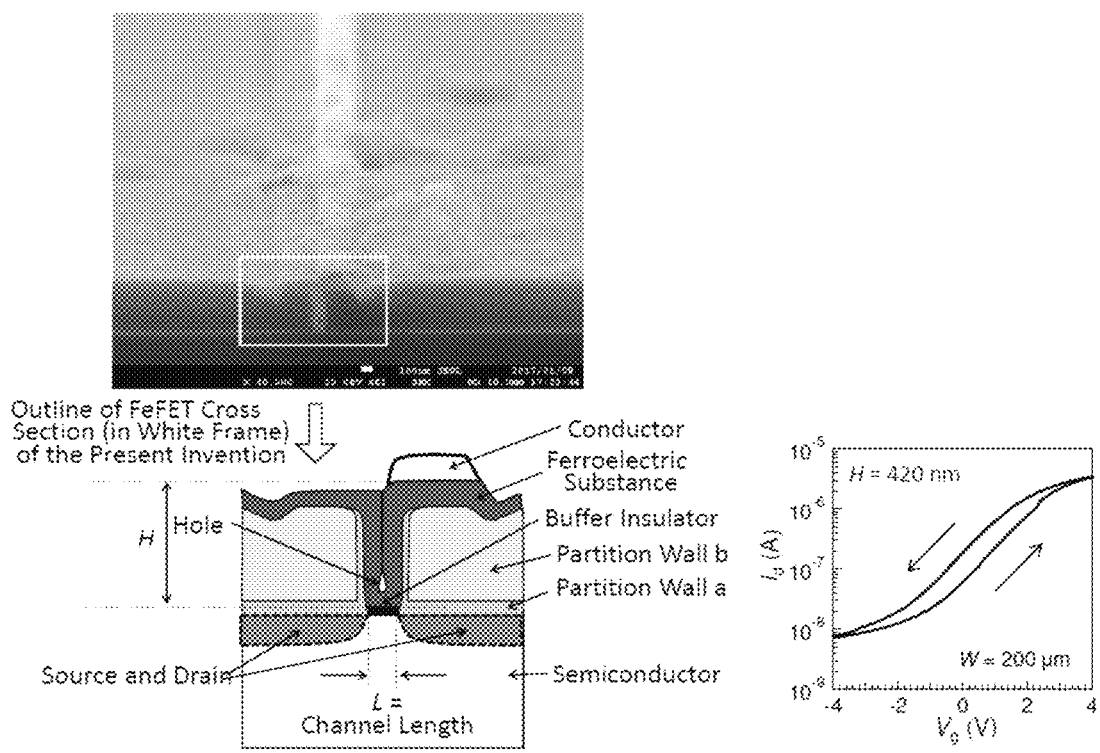
Figure 6D:
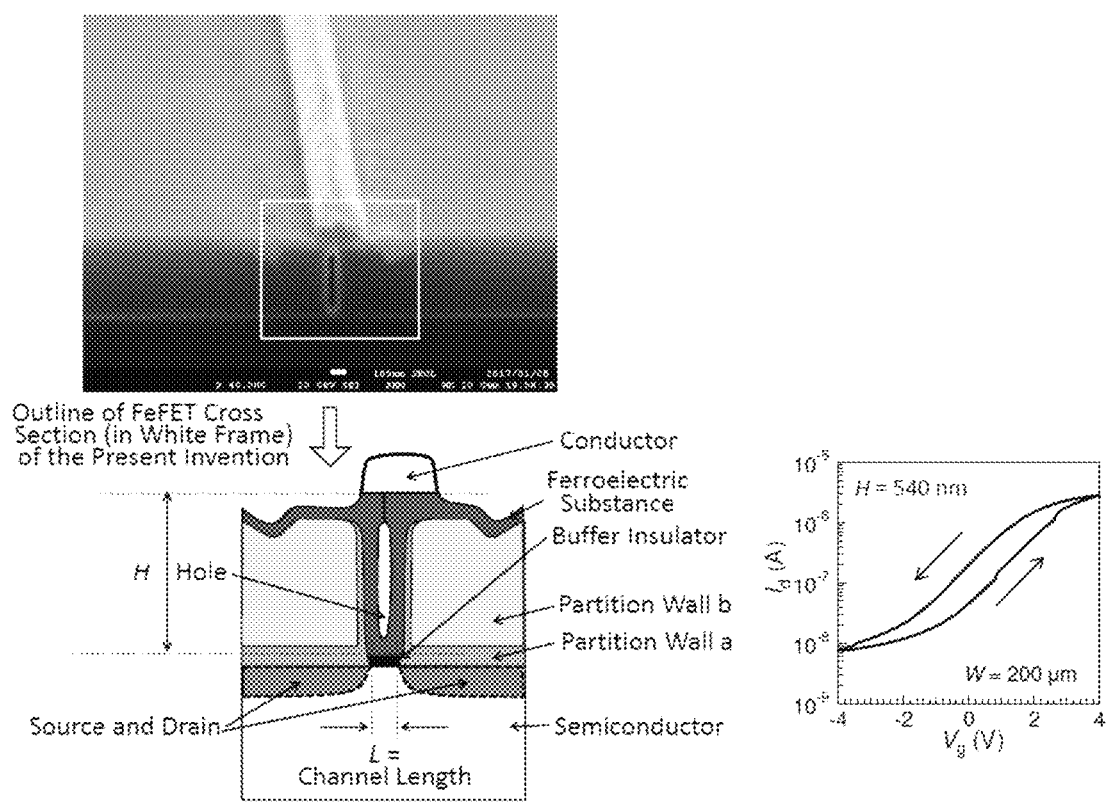

In the FeFET according to the present invention, that is, the embedded type FeFET, in order to widely secure the memory window, it is sufficient to increase the effective film thickness of the ferroelectric, which is realized by deeply designing the groove to be embedded, and it does not depend on length L. An example of experimental results is shown in FIGS. 6(b), (c) and (d). These experimental results are sectional SEM photographs of each of FeFETs of different H, its schematic view, and measured data of drain current-gate voltage (Id-Vg) characteristics. By judging from the sectional SEM photographs, H was 370 nm in (b), (c) H was 420 nm in (c), and H was 540 nm in (d). In common with the three FeFETs exemplified in FIGS. 6(b), (c) and (d), L was about 100 nm. In common with these FeFET, the MFIS of the gate laminated structure was in this order Ir, Ca—Sr—Bi—Ta—O oxide CSBT ferroelectric, $HfO_2$ insulator, and Si semiconductor. These CSBT film were formed by the MOCVD method. In common with these FeFET, the source and drain were formed in self-alignment to the protruding structure on the Si semiconductor substrate by P+ion injection, and the acceleration energy was 5 keV and the dose was 5E12. In common with these FeFET, after forming the upper electrode of Ir by etching, polycrystallization annealing at about 800° C. for 30 minutes was performed in a mixed gas of oxygen and nitrogen. The FeFET of FIG. 6(b) was annealed at a slightly higher temperature than the FeFET of FIGS. 6(c) and 6(d). For the three FeFETs illustrated in FIGS. 6(b), 6(c) and 6(d), Id was measured by sweeping Vg in the range of ±4 V and the Id-Vg curve was examined. Vg indicating Id=1.0 E−9 (A/µm) was judged as Vth, and the difference between the left and right Vth on the Id-Vg curve was defined as a memory window. As a result, each memory window was 0.6 V in FIG. 6(b), 0.8 V in FIG. 6(c), and 1.1 V in FIG. 6(d). In other words, the larger the H of the FeFET is, the more the memory window tends to widen. The gate width (W) was 80 µm, 200 µm, and 200 µm in the order of the FeFET in FIGS. 6(b), (c), and (d). The memory window does not depend on the magnitude of the gate width.

In the semiconductor memory element according to one embodiment of the present invention, the $C_I$ is increased in order to make the $C_F/C_I$ as small as possible for the purpose of widely securing the memory window of the FeFET. In order to maintain FeFET performance while avoiding inadvertent charge injection or leakage current during operation of the FeFET, it is not advantageous to make the physical thickness of the buffer insulator extremely thin. Therefore, in order to increase the $C_I$, the ratio of the voltage applied to the buffer insulator is made as small as possible. For this purpose, it is effective to use a high dielectric (high-k) material with a high dielectric constant $\in_I$ for the buffer insulator. The buffer insulator plays a role of preventing mutual diffusion of elements between a ferroelectric and a semiconductor caused by high-temperature baking aimed at polycrystallization of a ferroelectric. In this respect, for example, suitable high-k materials as a buffer insulator are used for an FeFET together with a bismuth layered perovskite type ferroelectric material such as $SrBi_2Ta_2O_9$ and $Ca_xSr_{1-x}Bi_2Ta_2O_9$ are $HfO_2$ and $(HfO_2)_y(Al_2O_3)_{1-y}$, etc.

Figure 7:
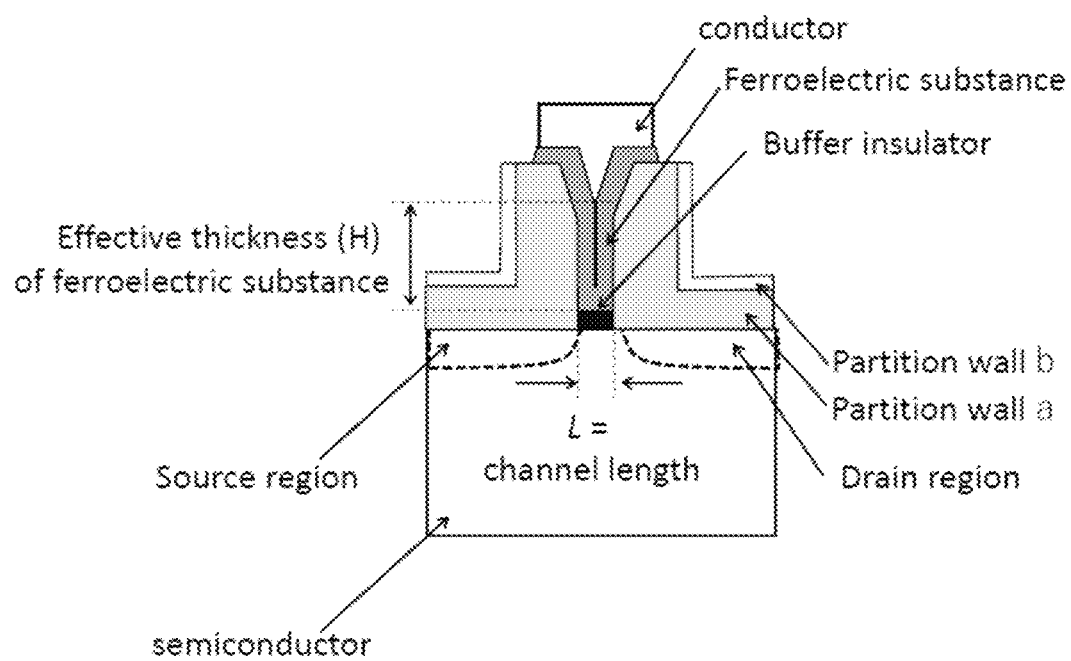
FIG. 7 shows a sectional view of a semiconductor memory element according to another embodiment of the present invention. The ferroelectric may also be etched simultaneously in a self-aligning manner.
Figure 8:
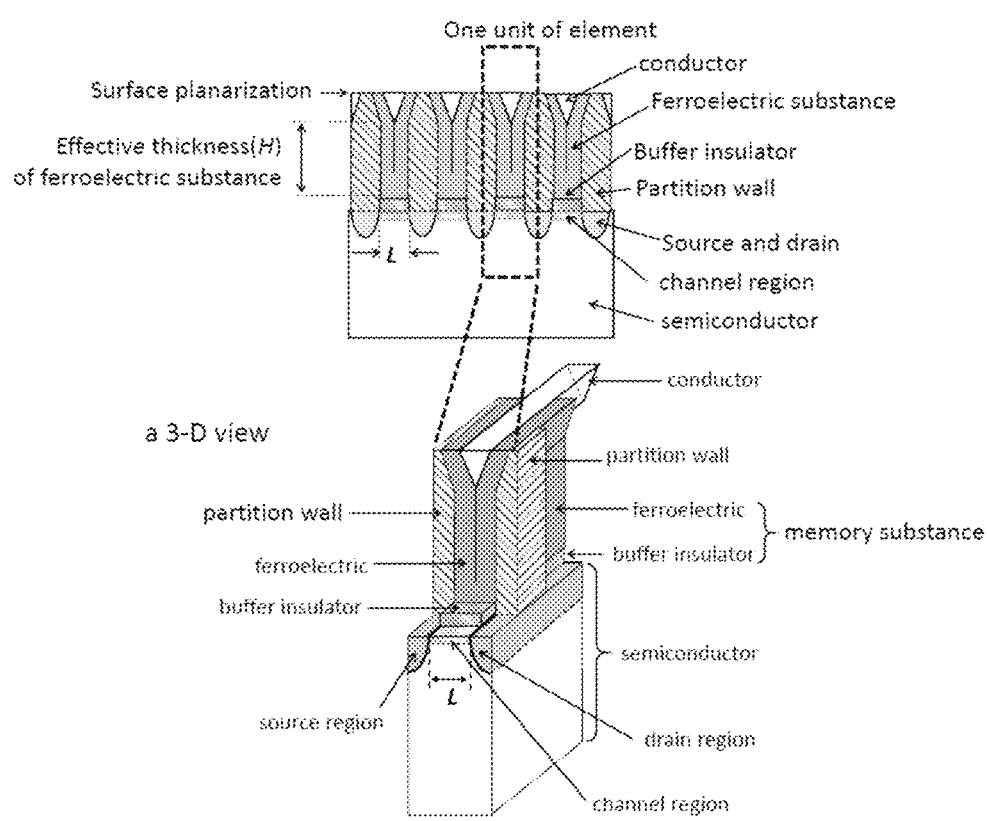
FIG. 8 shows a sectional view of a semiconductor memory element according to another embodiment of the present invention. This is a case where a plurality of FeFETs are integrated at a high density.

A semiconductor memory element, which is one embodiment of the present invention, comprises a buffer insulator molded by etching, a semiconductor substrate having source and drain regions in a self-aligned positional relationship to the buffer insulator, and a FeFET produced by firstly forming a deep groove in the partition wall, which is similarly in a self-aligned positional relationship to the buffer insulator, and then embedding the ferroelectric in the deep groove by a metal organic chemical vapor deposition. A conductor film is formed on the ferroelectric and formed into a gate electrode shape by etching. When forming the conductor as shown in FIG. 7, the ferroelectric may also be etched simultaneously in a self-aligning manner. In addition, the top of the conductor and the ferroelectric may be formed in a self-aligned manner by a surface planarization method such as a chemical mechanical polishing (CMP) method. As a result of breaking the connection between adjacent elements by the ferroelectric as described above, even when a plurality of FeFETs are integrated at a high density as shown in FIG. 8, it is possible to prevent erroneous operations such as erroneously writing data in the adjacent FeFET between adjacent FeFET.

Figure 9:
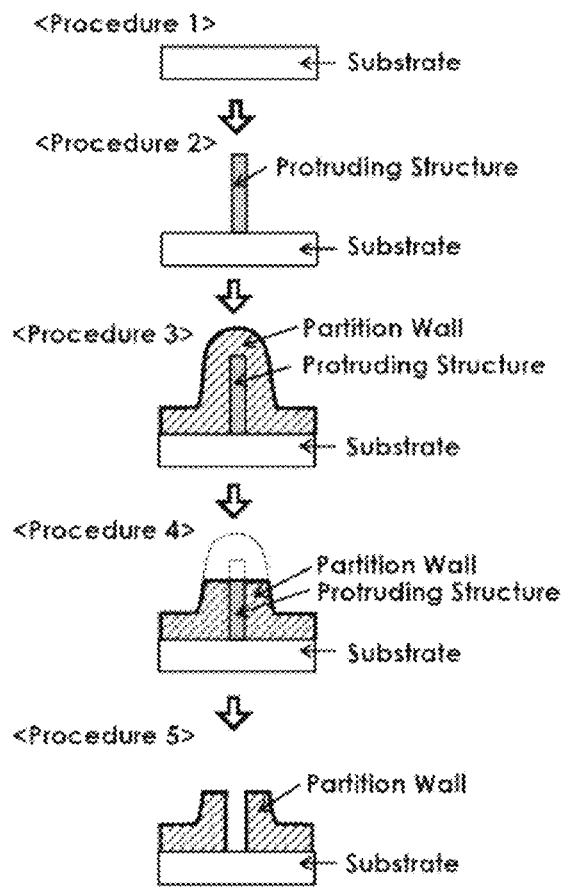
FIG. 9 shows a schematic view showing an example of a deep groove production method according to another embodiment of the present invention.

An example of a deep groove production method according to one embodiment of the present invention will be described with reference to a schematic view (FIG. 9). A substrate is prepared (Procedure 1). A protruding structure with a width equal to or smaller than 100 nm is formed on the substrate (Procedure 2). The protruding structure is covered with a partition wall (Procedure 3). The partition wall is cut from the top until the top of the protruding structure is exposed (Procedure 4). And, the protruding structure is removed (Procedure 5).

Figure 10:
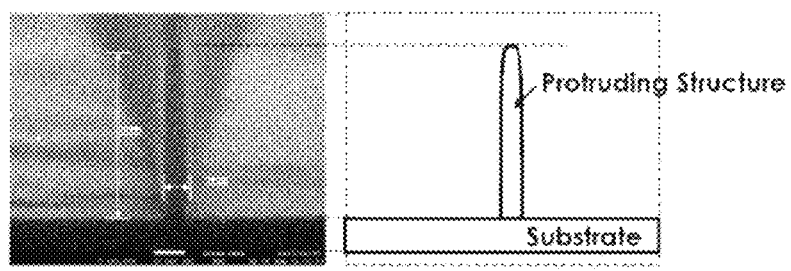
FIG. 10 shows a sectional SEM photograph of a protruding structure formed on the substrate. This figure is an example corresponding to Procedure 2.
Figure 11:
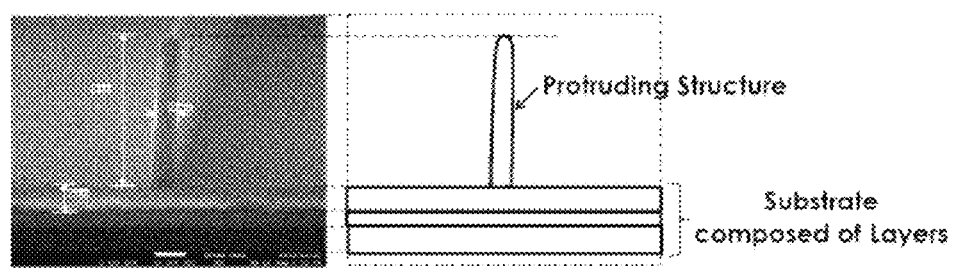
FIG. 11 shows a sectional SEM photograph of a product having a protruding structure with a width of 69.5 nm and a height of 481 nm formed on a substrate composed of three layers.
Figure 12:
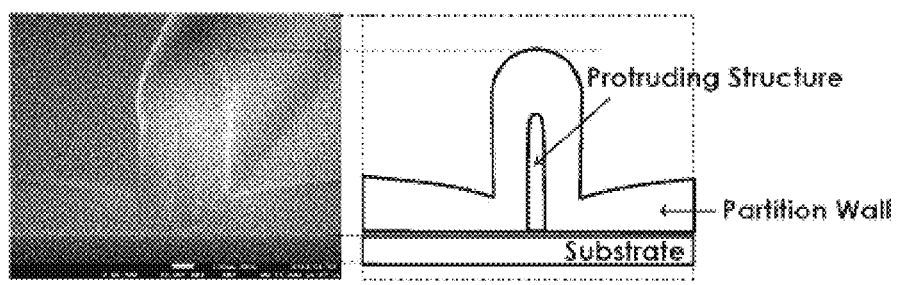
FIG. 12 shows a sectional SEM photograph of a protruding structure covered with a partition wall. This figure is an example corresponding to Procedure 3.
Figure 13:
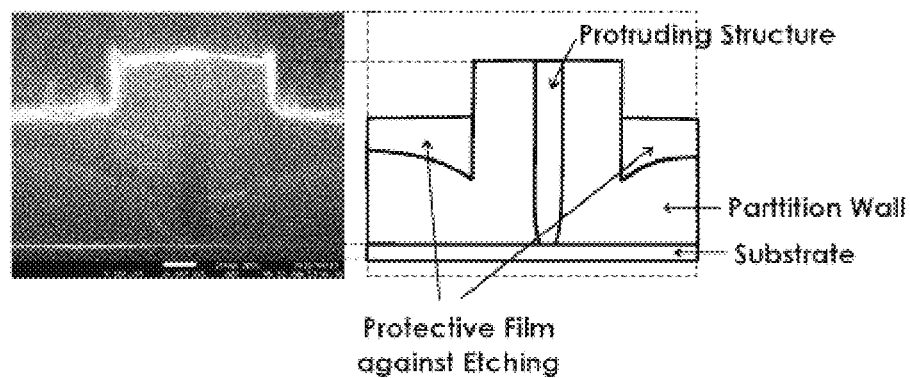
FIG. 13 shows a sectional SEM photograph of the object, in which the protruding structure is covered with the partition wall, and the partition wall is cut from the top until the upper part of the protruding structure is exposed. This figure is an example corresponding to the Procedure 4.
Figure 14:
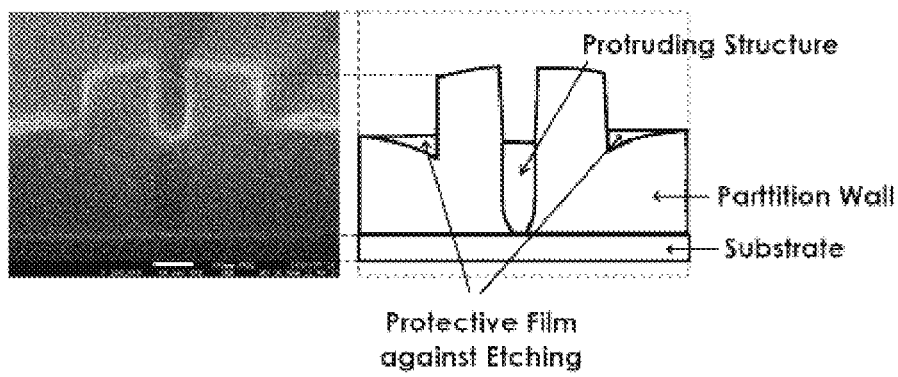
FIG. 14 shows a sectional SEM photograph of the object, in which the protruding structure is covered with the partition wall, the partition wall is cut from the top until the upper part of the protruding structure is exposed, and the protruding structure is partially removed. This figure is an example corresponding to a middle stage of the Procedure 5.
Figure 15:
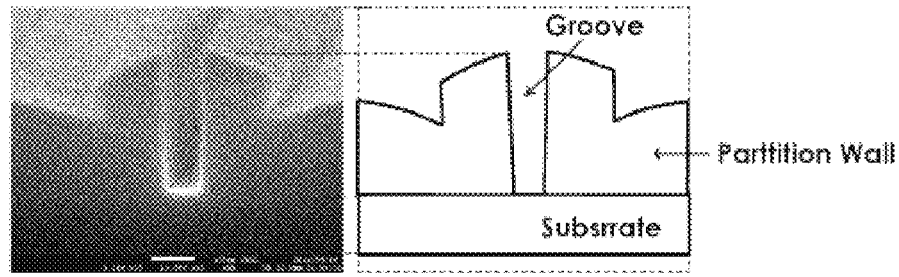
FIG. 15 shows a sectional SEM photograph. This figure is an example corresponding to the completion of the Procedure 5.

FIG. 10 is a sectional SEM photograph of the protruding structure formed on the certain substrate. This figure is an example corresponding to the Procedure 2. The protruding structure has a width of 82 nm and a height of 525 nm. The substrate may be a laminate. FIG. 11 is a sectional SEM photograph of the protruding structure having a width of 69.5 nm and a height of 481 nm formed on the substrate composed of three layers. FIG. 12 is a sectional SEM photograph of the protruding structure covered with the partition wall. This figure is an example corresponding to the Procedure 3. FIG. 13 is a sectional SEM photograph of the object, in which the protruding structure is covered with the partition wall, and the partition wall is cut from the top until the upper part of the protruding structure is exposed. This figure is an example corresponding to the Procedure 4. FIG. 14 is a sectional SEM photograph of the object, in which the protruding structure is covered with the partition wall, the partition wall is cut from the top until the upper part of the protruding structure is exposed, and the protruding structure is partially removed. This figure is an example corresponding to a middle stage of the Procedure 5. FIG. 15 is a sectional SEM photograph. This figure is an example corresponding to the completion of the Procedure 5.

The protruding structures seen in the photographs in FIGS. 10 to 14 are carbon-containing organic substances, and the method, in which the protruding structures are removed in FIGS. 14 and 15, is an oxygen plasma etching. The partition wall is silicon oxide. In every figure, the left side is the original picture and the right side is a schematic view explaining the structure of the subject.

Figure 16:
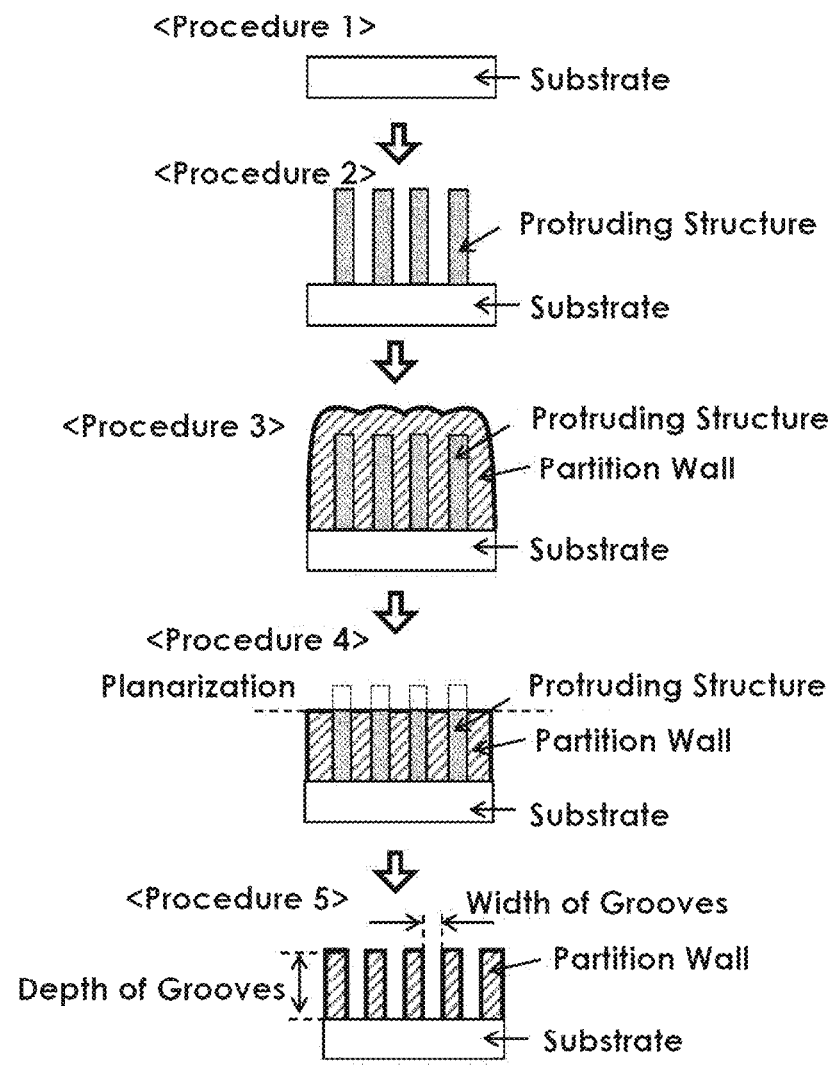
FIG. 16 shows a schematic view indicating an example of a production method in a case where deep grooves are accumulated at a high density according to another embodiment of the present invention.

An example of a production method, in which the deep grooves are integrated at high density according to the embodiment of the present invention, will be described with a schematic view (FIG. 16).

A substrate is prepared (Procedure 1). A protruding structure with a width equal to or smaller than 100 nm is formed on the substrate (Procedure 2). The protruding structure is covered with a partition wall (Procedure 3). Polishing for surface planarization is performed from the top until the upper part of the protruding structure is exposed (Procedure 4). Thereafter, the protruding structure is removed (Procedure 5).

Figure 17:
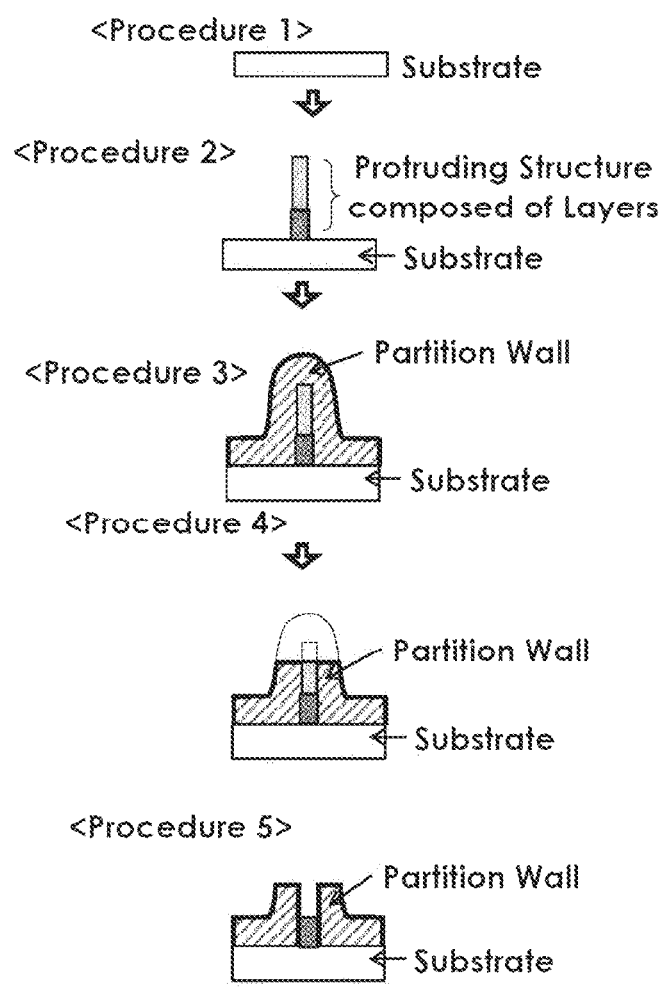
FIG. 17 shows a schematic view indicating a production method of a deep groove.
Figure 18:
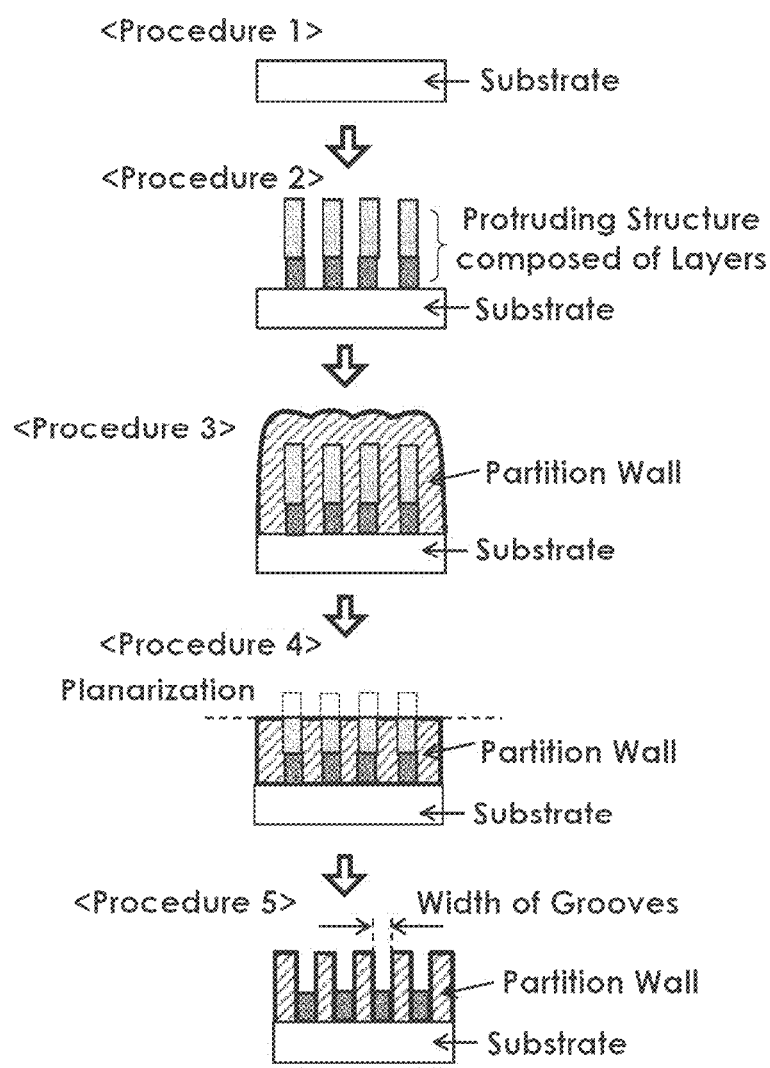
FIG. 18 shows a schematic view of a production method of highly integrated deep grooves.

In the present invention, the protruding structure may be formed of a laminate. In the case of selectively removing other layers except the lowermost layer of the protruding structure, a schematic view of a production method of a single deep groove is shown in FIG. 17, and a schematic view of a production method of highly integrated deep grooves is shown in FIG. 18.

Figure 19:
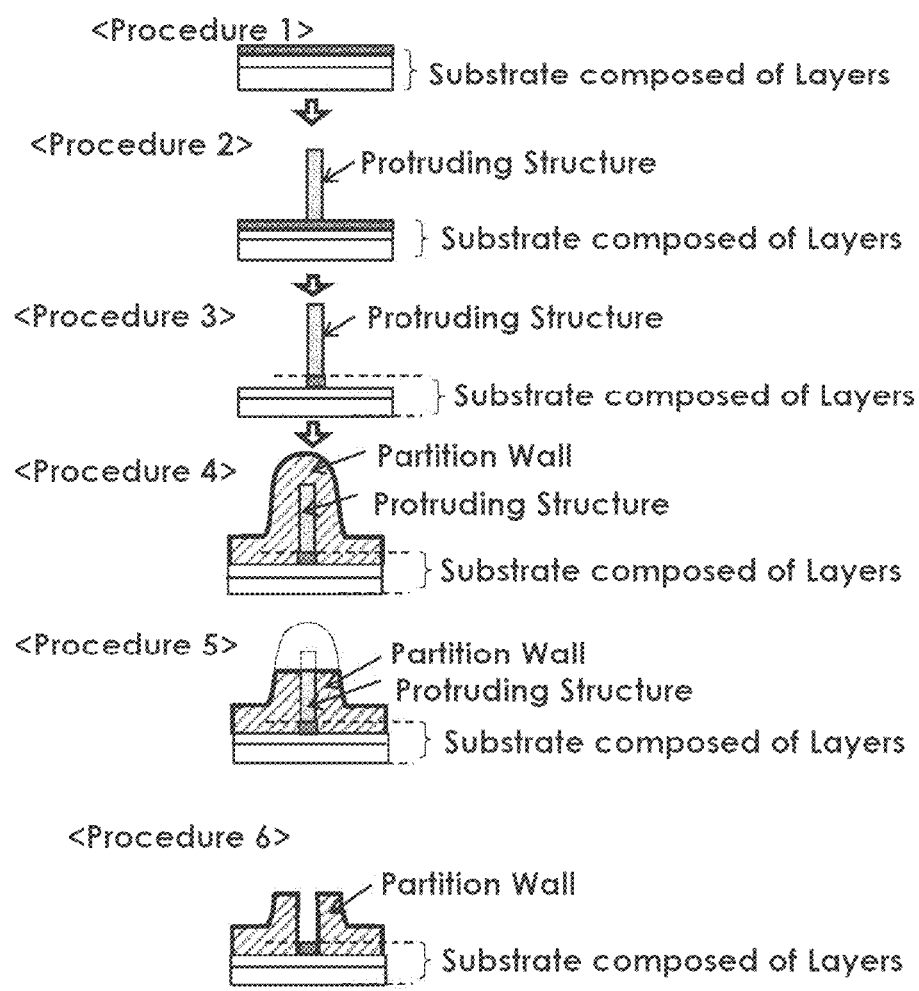
FIG. 19 shows a schematic view of a production method of a single deep groove in a case where the uppermost layer of the substrate is etched in a self-aligned manner to the protruding structure.
Figure 20:
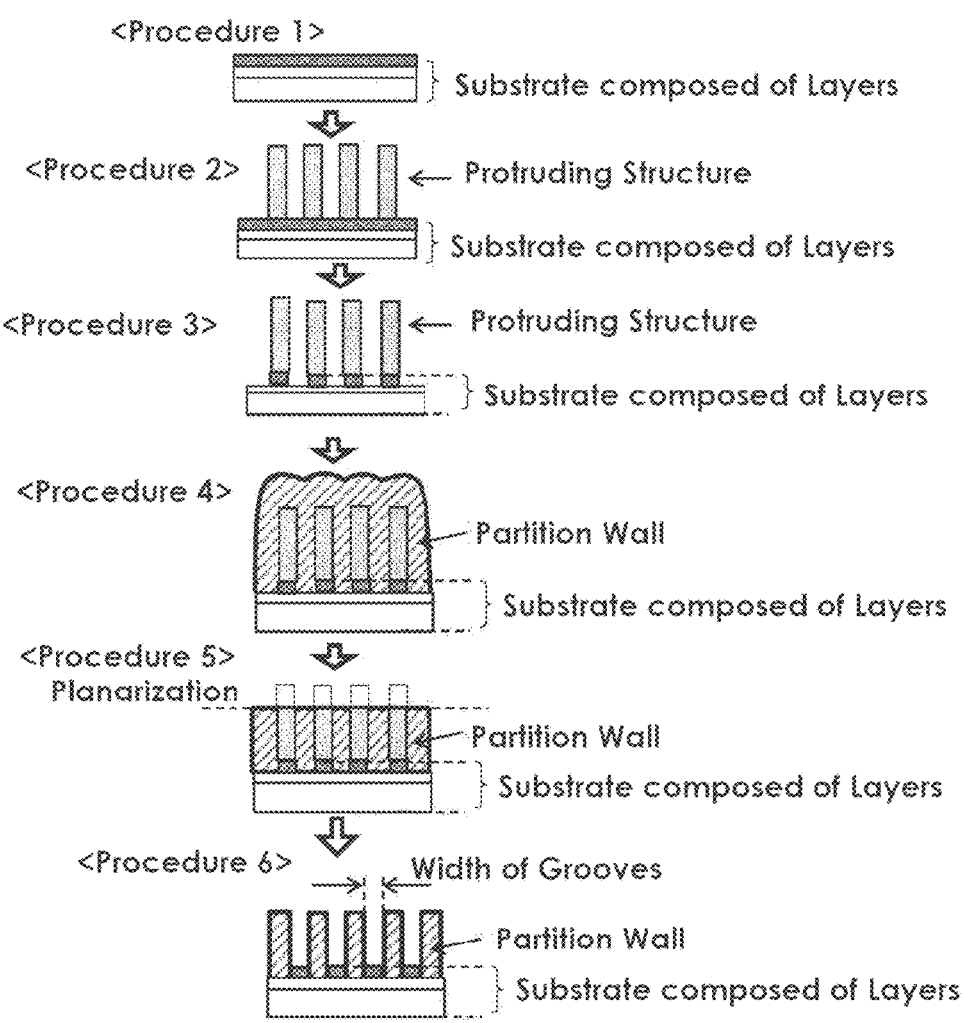
FIG. 20 shows a schematic view of a production method of highly integrated deep grooves.

In the present invention, the substrate may also be composed of laminates. FIG. 19 is a schematic view of a production method of a single deep groove in a case where the uppermost layer of the substrate is etched in a self-aligned manner to the protruding structure, and FIG. 20 is a schematic view of a production method of deep grooves integrated at a high density.

Figure 21:
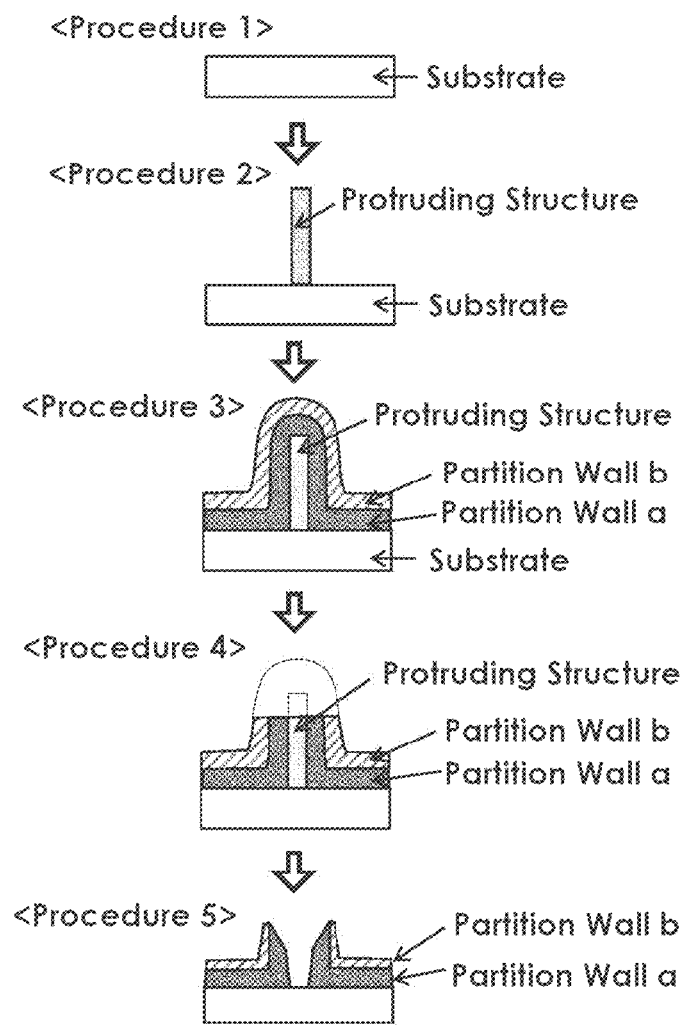
FIG. 21 shows a production method the deep groove according to an embodiment of the present invention, where the partition walls are laminated.
Figure 22:
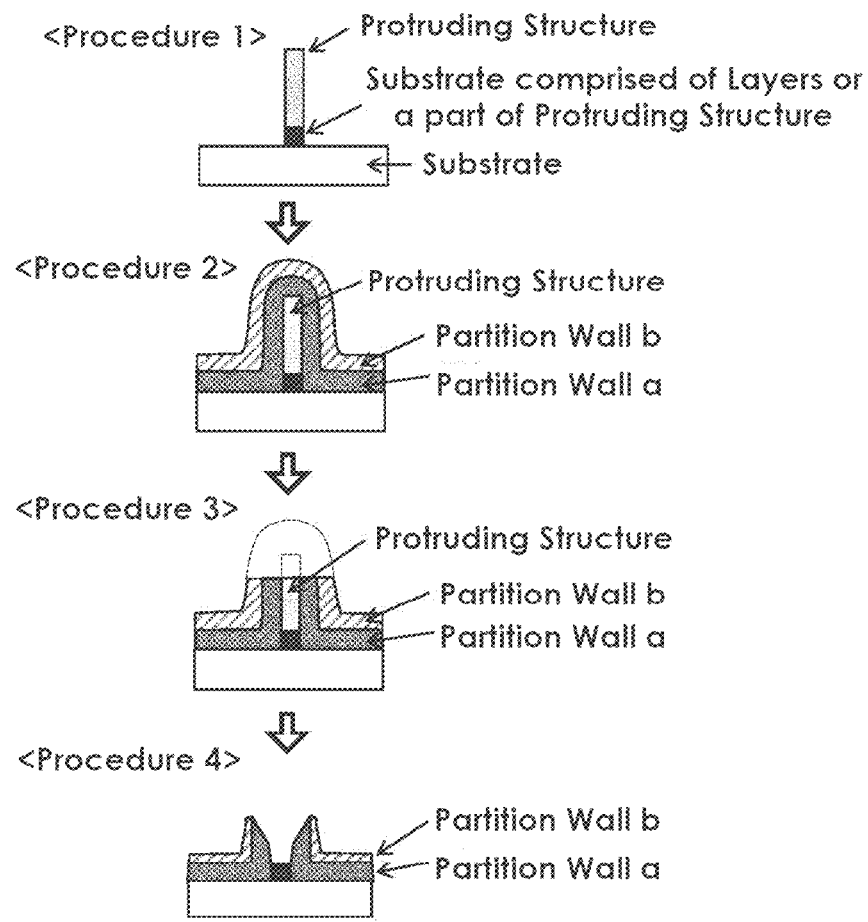
FIG. 22 shows a view indicating a case where a substrate or a protruding structure is laminated and a part of these is intentionally left at the bottom of the deep groove.

In a production method of the deep groove, which is the embodiment of the present invention, the partition wall may be a laminate. For example, as shown in FIG. 21, in a case where an outside partition wall's material, whose etching speed is slower than that of an inside partition wall a, is selected, when etching is simultaneously executed from the top in an adequate condition, an opening of an upper of a deep groove becomes wider than that of bottom because the decrement of the partition wall a is faster than the decrement of the partition wall b. In the case where the substrate or the protruding structure is the laminate, the part of the laminate may be intentionally remained as shown in FIG. 22.

Figure 23:
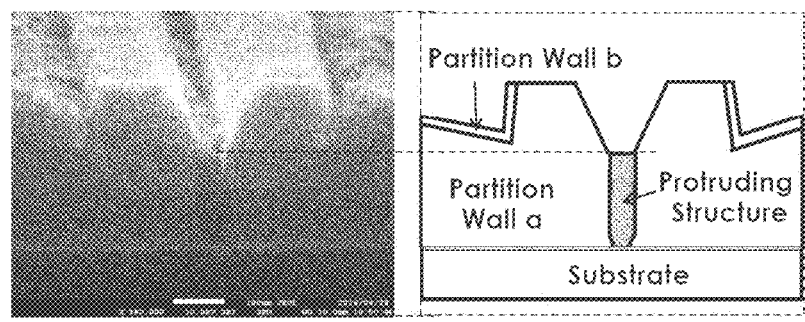
FIG. 23 shows a sectional SEM photograph of the middle stage of the production process, in which the opening of the upper part of the deep groove is broadened by using the laminated partition wall. The left side shows the original photograph, and right side shows the schematic view explaining the structure of the subject. These figures show the stage before removing the organic protruding structure.
Figure 24:
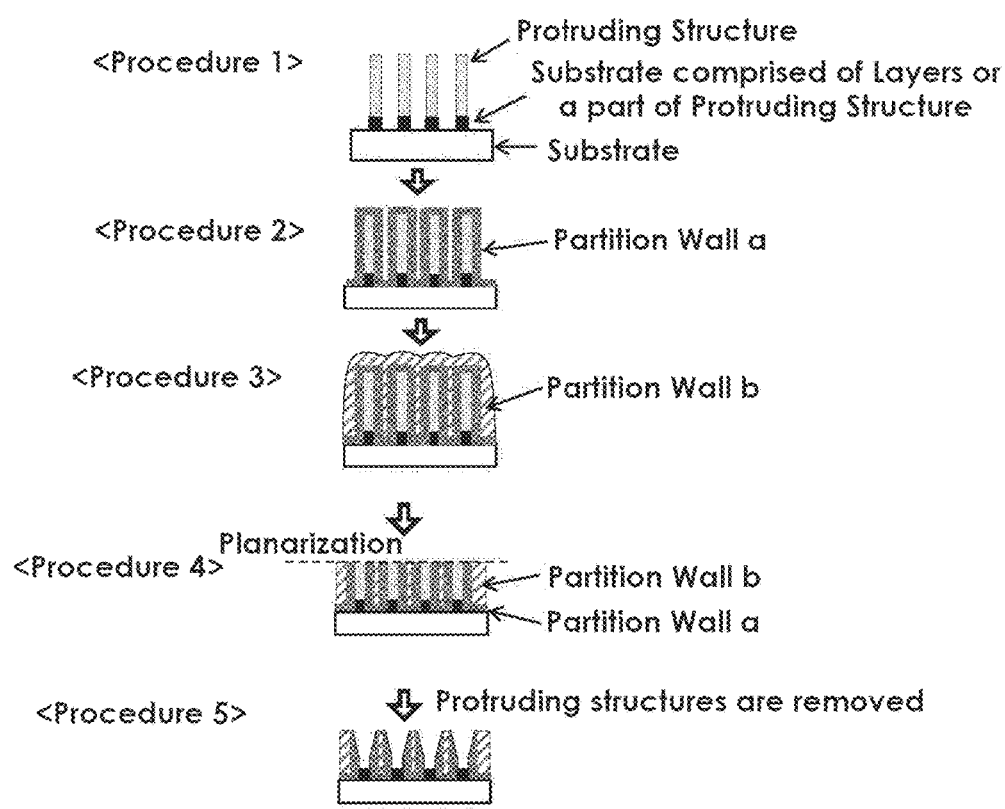
FIG. 24 shows a schematic view of the production method, in which the partition walls are laminated and the deep grooves are integrated at a high density.

FIG. 23 shows a sectional SEM photograph of the middle stage of the production process, in which the opening of the upper part of the deep groove is broadened by using the laminated partition wall. Left side shows the original photograph, and right shows the schematic view explaining the structure of the subject. FIG. 23 yet shows the stage before removing the organic protruding structure. In the laminated partition wall shown in FIG. 23, the partition wall a is silicon oxide and the partition wall b is aluminum oxide. By selecting the adequate etching condition, a slope, which becomes broaden toward to the upper part from substrate, can be attained at the opening part of the deep groove. For example, as shown in FIG. 23, the opening at the upper part of the deep groove can also be broadened till the shape of an inverted triangle by using the adequate etching condition. Simultaneously, a schematic view of the production method, in which the partition walls are laminated and the deep grooves are integrated at high density, is shown in FIG. 24.

One embodiment of the present invention is an electric device, in which a functional material is embedded in the deep groove formed by the described production method. The embedded material is not specifically limited. For example, a memory element, in which a memory substance such as a ferroelectric material, a magnetic material, or a charge trapping material is embedded, can be cited. And, an electric wiring, in which a conductor is embedded, can be cited. Also, an optical wiring, in which a light transmitting material is embedded, is cited. In either case, according to the present invention, the material to be embedded is not directly etched, and then the risk of being subjected to etch damage is suppressed. Even with a material difficult to etch, since it can be easily formed into a high aspect shape having a width equal to or smaller than 100 nm, and an effective height exceeding double of the width, a high integration can be easily achieved in the substrate not depending on the etching accuracy resulted from the material. For the method of embedding the above-mentioned various materials in the deep groove, CVD or MOCVD method having excellent step coverage is effective.

Figure 25:
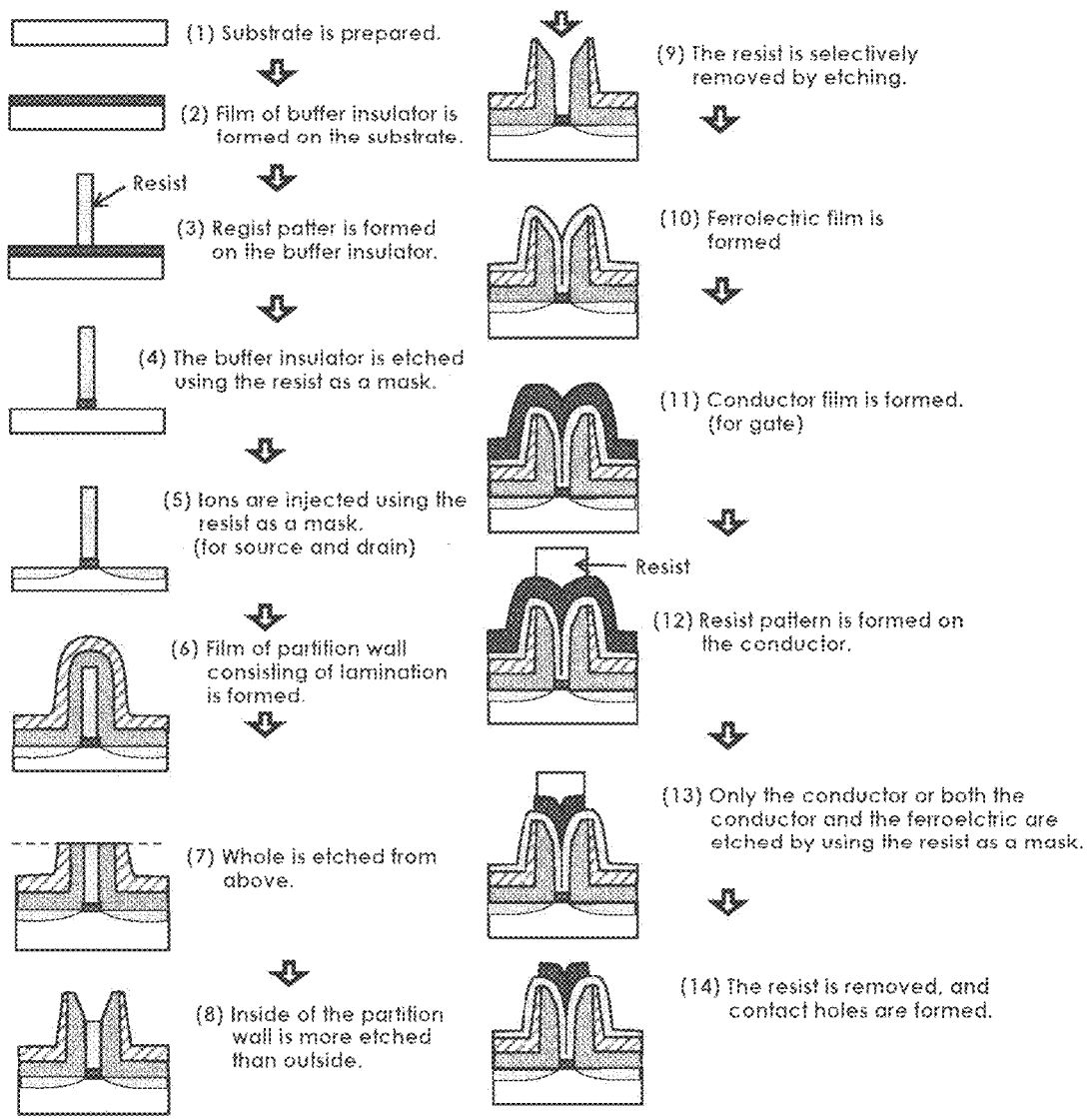
FIG. 25 shows an example of a single element production process.

A production method of the embedded ferroelectric gate field effect transistor (FeFET), which is one embodiment of the present invention, will be described in detail. FIG. 25 shows an example of a single element production process. At first, (1) a silicon semiconductor substrate, whose surface is treated with hydrofluoric acid, is prepared.

Next, (2) a high dielectric film containing hafnium oxide is formed as a buffer insulator.

Next, (3) using a lithography such as electron beam lithography, a pattern of an organic resist, which becomes a prototype of the deep groove, is formed on the buffer insulator. The line width of the pattern is equal to or smaller than 100, and the height is equal to or larger than double of the line width.

Next, (4) the buffer insulator is etched using the pattern, which becomes the prototype of the deep groove, as a mask to expose the surface of the substrate.

Next, (5) ions are injected into the surface of the substrate in a self-aligned manner to the pattern, which becomes the prototype of the deep groove, and the buffer insulator. The injected ions pass through an activation annealing described later, and form the source and the drain of the FeFET. As an injection condition, if the substrate is a p-type for example, ions, which locally make the substrate n-type, may be injected shallowly. For example, ion injection of monovalent phosphorus (P+) may be performed under conditions of an acceleration energy of 5 keV and a dose amount of $5 \times 10^{12}/cm^2$.

Next, (6) an insulator film to become the partition wall is formed to cover the pattern, which becomes the prototype of the deep groove. This insulator consists of a lamination using materials such as silicon oxide, silicon nitride, aluminum oxide, hafnium oxide, etc., and may be two-layered or three or more-layered. The order of film formation, that is, the order of laminating, may be any combination. For example, in the case of two layers, the silicon oxide may be firstly laminated and the silicon nitride may be secondly laminated, or vice versa. Or, the hafnium oxide may be firstly laminated and the silicon oxide may be secondly laminated, or vice versa.

(7) The whole is etched from above. The area not desired to be etched is previously covered with a protective film. The etching time is adjusted so as to be the time until the upper part of the pattern, which becomes the prototype of the deep groove, is exposed. Preferable etching conditions are such that vertical anisotropy is enhanced by using a process gas suitable for selectively etching of a main portion of the material used for the partition walls. For example, when the partition wall is mainly composed of silicon oxide, inductively coupled plasma type reactive ion etching (ICP-RIE) with antenna RF and bias RF of 250 W and 300 W respectively is carried out using argon and $CF_4$ as a process gas may be used.

Next, if necessary, (8) etching for expanding the opening at the top of the groove may be optionally performed. After covering the area not to be etched with the protective film, it is preferable to use conditions for selectively etching the inner side of the lamination forming the partition wall by RIE or the like from the outside, or conditions for anisotropically etching by argon ion milling or the like from the diagonally upward direction with respect to the substrate.

Next, (9) by using the pattern to be the prototype of the exposed deep groove, the partition wall and the buffer insulator are selectively removed to form the deep groove. If the pattern to be the prototype of the deep groove is a resist, it may be removed by the oxygen plasma etching.

Next, (10) the ferroelectric film is formed from above the deep groove. Before forming the ferroelectric film, annealing may be performed to activate the ions implanted on the surface of the substrate in the early stage of the present production process to form the source and the drain of the FeFET. Film formation conditions for the ferroelectric are executed using a film formation method with good step coverage, for example, metal organic chemical vapor deposition or atomic layer deposition. When the buffer insulator is a high dielectric containing hafnium oxide as in this example, a bismuth layered perovskite type ferroelectric material such as $SrBi_2Ta_2O_9$ or $Ca_xSr_{1-x}Bi_2Ta_2O_9$ is used.

Next, (11) the conductor film is formed. High temperature annealing aimed at polycrystallization of the ferroelectric is performed before or after the film formation of the conductor. When a bismuth layered perovskite ferroelectric material such as $SrBi_2Ta_2O_9$ or $Ca_xSr_{1-x}Bi_2Ta_2O_9$ etc. is used as the ferroelectric, the annealing temperature for the polycrystalline is often a high temperature between about 700° C. and 800° C. If an annealing for activating ions implanted on the surface of the substrate has not yet been performed at the beginning of the present production process, the ferroelectric polycrystallization annealing may also serve as the annealing for activating ions. The ferroelectric polycrystallization annealing may be performed after forming the conductor film into a gate shape, but may also be performed before forming the conductor film. When the annealing is executed after the film formation of the conductor, high temperature resistance is required for the conductor. Noble metals such as platinum or iridium etc. are often used as high-temperature resistant conductor materials. Also, according to an appropriate film formation method such as an atomic layer deposition method, nitrides of titanium or tantalum may also have high temperature resistance. On the other hand, when the annealing is executed before the film formation of the conductor, high temperature resistance is not required for conductors, and then choices are expanded for inexpensive conductor materials other than platinum and iridium. An inexpensive conductive material is, for example, one having conductivity among aluminum, titanium, hafnium, tantalum, silicon, or a nitride or a compound thereof.

(12) On the conductor, a resist pattern film is formed on the shape of the gate of the FeFET by lithography.

(13) Using the resist pattern as a mold, only the conductor or both the conductor and the ferroelectric are etched. The position of the resist pattern for this purpose is the position, at which the projection image on the substrate covers the projection image of the pattern used as the prototype of the deep groove at the beginning of the present production process. Inevitably, the gate of the FeFET covers the channel region on the substrate.

(14) Finally, the resist is removed, and contact holes are appropriately formed in the source, the drain, the substrate, and the gate. Using the production method of FIG. 25, it is possible to product an FeFET composed of a metal-ferroelectric-insulator-semiconductor so-called MFIS structure. According to the present invention, the channel length of the FeFET is determined by the width of the pattern as the prototype of the deep groove of process (3), and the effective thickness of the FeFET is determined by the depth of the deep groove of process (9). Then, it is possible to achieve both miniaturization of the FeFET within the substrate plane and securing of a large memory window. Among the materials exemplified in the processes (1) to (14) described above, the material of the pattern, which stands on the buffer insulator in the process (3) and becomes the prototype of the deep groove, is not restricted to an organic resist, and it can be changed to a heat resistant material such as inorganic polysilicon. In this case, it becomes possible to use a higher process temperature after process (3). This makes it possible to use a higher film forming temperature when forming the insulator film, which becomes the partition wall in process (6), and as a result, improvement of the quality of the insulator as the partition wall can be expected.

Figure 26:
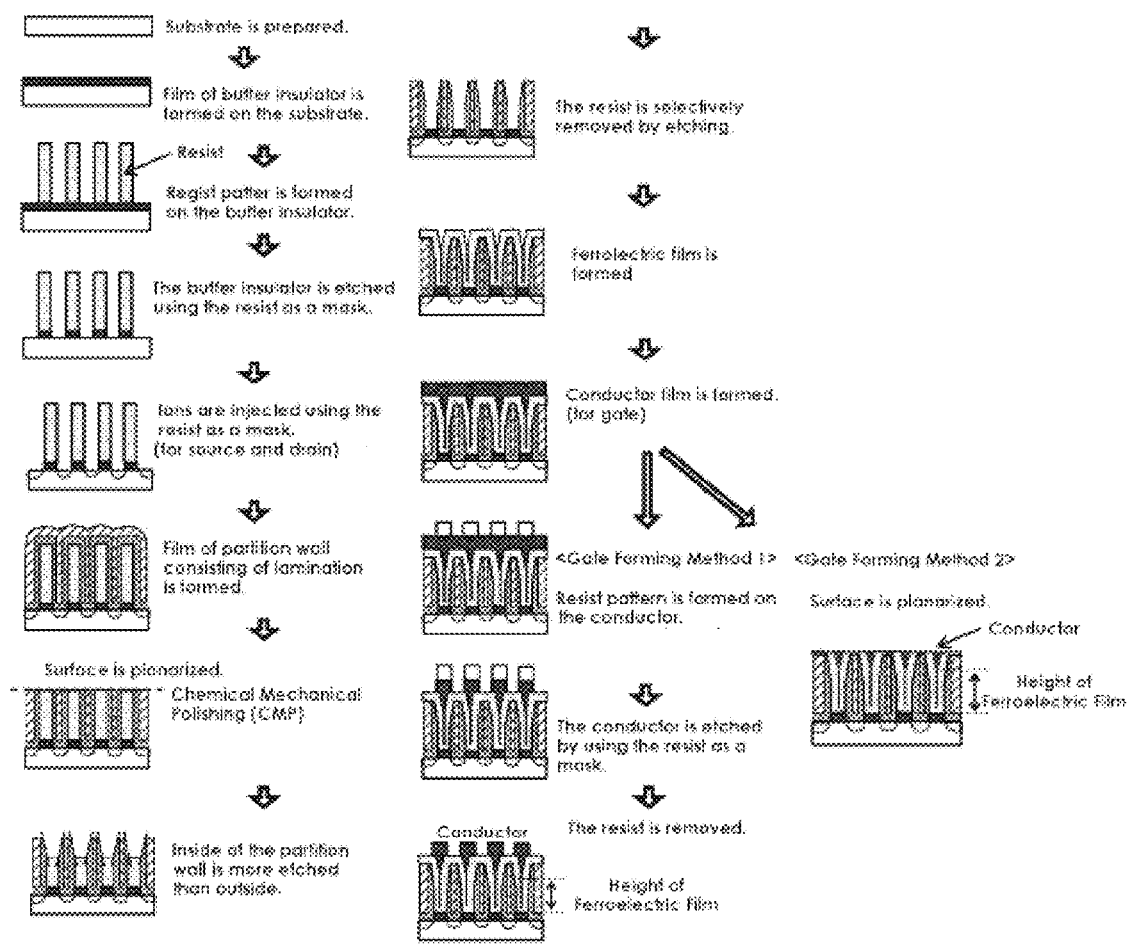
FIG. 26 shows an example of a production process in a case where FeFET are highly integrated on the same substrate.

FIG. 26 shows an example of a production process in a case, where FeFET are highly integrated on the same substrate. It is essentially the same as the production process of an FeFET single element shown by way of example in FIG. 25. However, in the process corresponding to (7) in FIG. 25, in which the cutting is performed until the upper part of the pattern to become the prototype of the deep groove is exposed, the surface may be planarized by the chemical mechanical polishing (CMP) method as shown in FIG. 26. Also, in the process corresponding to (12) to (14) in FIG. 25, in which the conductor is manipulated into the shape of a gate, when the CMP method is adopted as the processing method, the conductor embedded in the opening of the deep groove aligns with the position just above the channel region of the FeFET in a self-aligning manner. It leads to reduction in the number of masks, and it is preferable.

An electronic circuit according to one embodiment of the present invention is composed of two or more elements obtained by simultaneously depositing a material having a memory function in grooves having different widths, and is characterized in that the height from the substrate of a material having a memory function filled therein is controlled by changing the widths of the groves, and the intensity of the memory function of each element is made variable. According to the present invention, the memory element and the non-memory element can be easily mixed.

Figure 27:
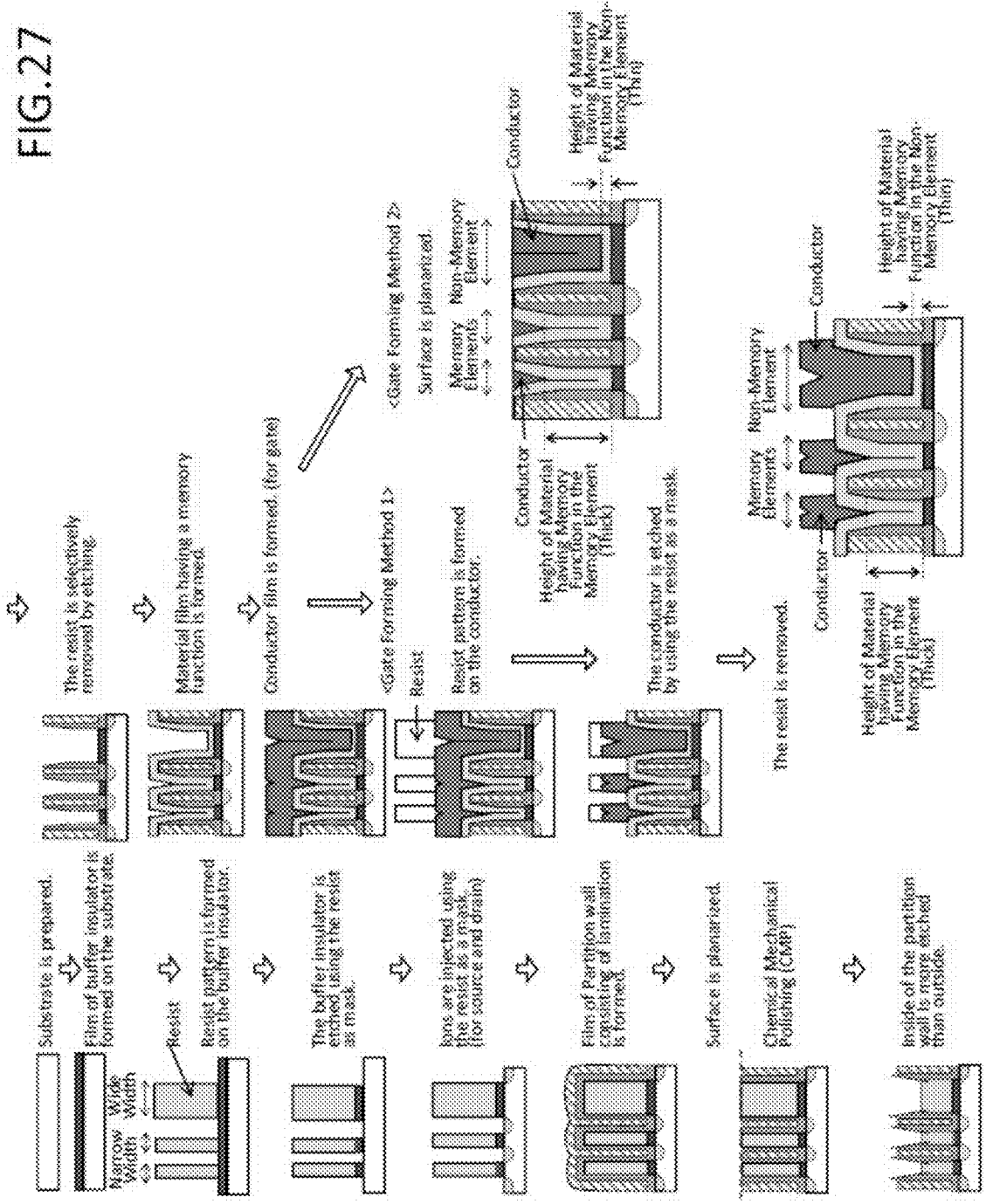
FIG. 27 shows a view indicating a production method of the electronic circuit according to the present invention.

A production method of the electronic circuit according to the present invention is described with reference to FIG. 27. It is essentially the same as the production process of the FeFET shown by way of examples in FIGS. 25 and 26. However, in the process corresponding to (3) in FIG. 25, in which the resist is patterned on the buffer insulator by lithography, the patterns to become the prototype of the grooves are formed in plural kinds of wide width and narrow width. As a result, a plurality of grooves having different widths are formed on the same substrate. A material film having a memory function is simultaneously formed on this substrate with an appropriate controlled film thickness. As a material having a memory function occupies a large proportion of its volume in the groove having a narrow width pattern as a prototype, the effective height of the material having a memory function finally increases.

On the other hand, in the groove having the wide pattern as the prototype, only the bottom surface and the side-surface thereof are covered with the material having the memory function, and the effective height of the material having the memory function finally becomes small. When the ferroelectric is used as an example of the material having the memory function and the FeFET is produced by using the present invention, the FeFET memory window is large and the FeFET strongly expresses nonvolatile memory function, since the FeFET's ferroelectric made from a narrow groove is effectively thick.

Figure 28:
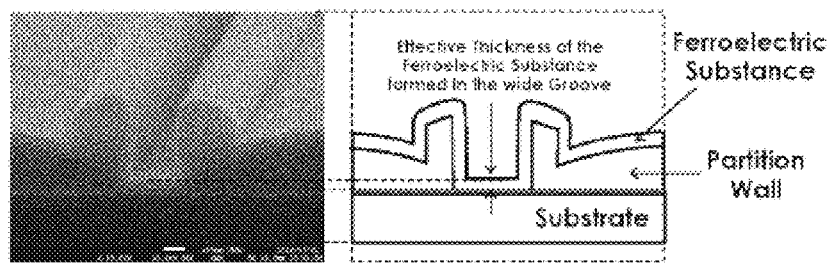
FIG. 28 shows a practical example, in which the ferroelectric covers only the bottom surface and the side-surface of the groove. The left side shows a sectional SEM photograph, and the right side shows a description of the subject.

Also, since the FeFET's ferroelectric made from the wide groove is effectively thin, the memory window of the FeFET is small and the nonvolatile memory function of the FeFET is weakened. In the FeFET, it is already known that the memory window decreases as the film thickness of the ferroelectric decreases, and the memory function of the element decreases (Patent Document 1). As a practical example, in which the ferroelectric film formed from the groove having the wide width pattern as the prototype covers only the bottom surface and the side-surface of the groove, a sectional SEM photograph is shown on the left side of FIG. 28 and the subject is described on the right side.

Figure 29:
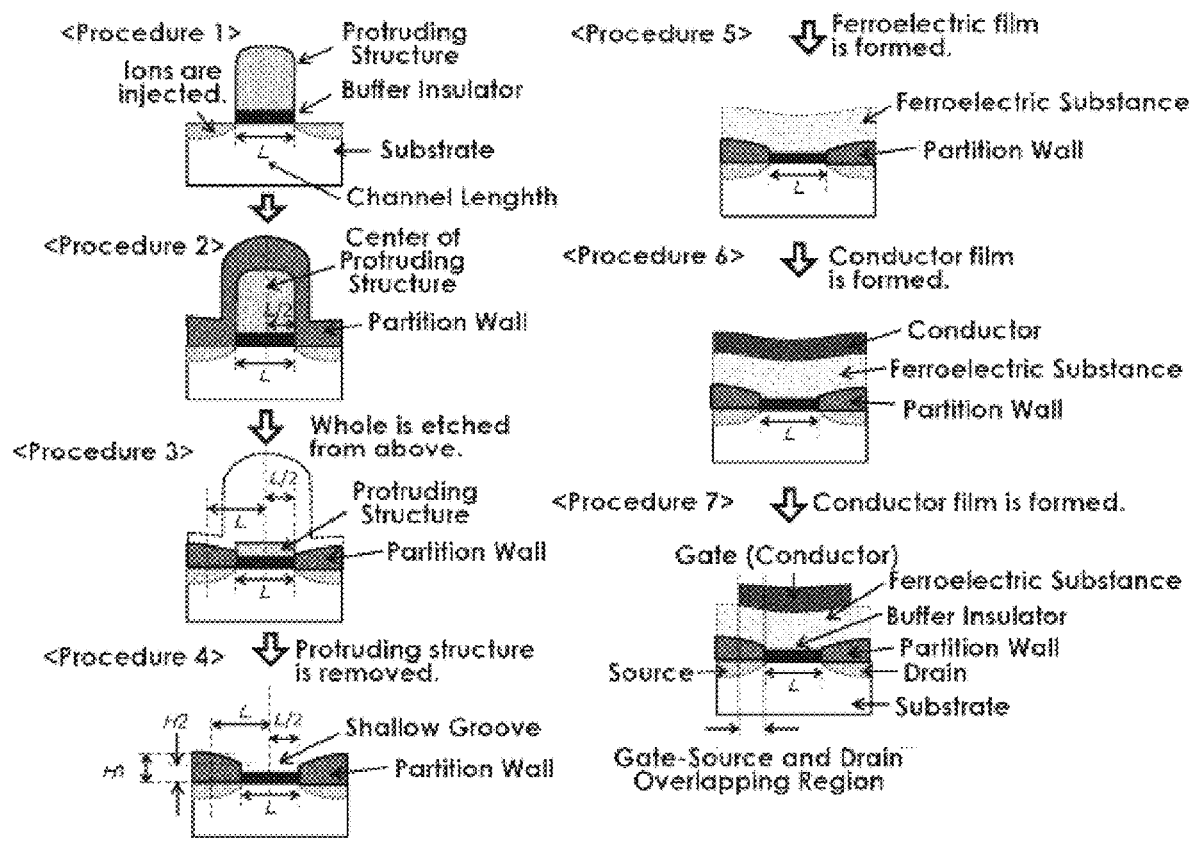
FIG. 29 shows a view indicating a production method of the FeFET according to one or more embodiments.

A production method of the FeFET, which is other embodiment of the present invention, is described with reference to FIG. 29.

<Procedure 1> A buffer insulator film is formed on the surface of a semiconductor substrate, and an organic protruding structure is formed thereon. After etching the buffer insulator using the protruding structure as a mask, ion inject for source and drain is executed on the semiconductor substrate in a self-aligning manner using the protruding structure and the buffer insulator as a mask. The distance between the source and the drain on the substrate is a channel length (L).

<Procedure 2> The protruding structure is covered with a partition wall.

<Procedure 3> The whole is etched from above. At this time, the etching is executed until for the height H2 of the partition wall in contact with the side-surface of the protruding structure to become lower than the height H1 of the partition wall in the position that is away from the center of the protruding structure to the left and right by a distance L.

<Procedure 4> The protruding structure is selectively etched with oxygen plasma to form a shallow groove.

<Procedure 5> A ferroelectric film is formed from the above of the groove.

<Procedure 6> Conductor film is formed from the above of the ferroelectric.

<Procedure 7> The conductor is formed into a gate shape just above the groove by lithography and etching.

According to the present invention, by setting the width of the protruding type structure, which becomes the groove mold, to 100 nm or less, the FeFET having a channel length of 100 nm or less can be produced without relying on etching of the ferroelectric. By producing the partition wall with the material having lower dielectric constant than the ferroelectric and the buffer insulator, the capacitance between the gate and the substrate of the FeFET can be effectively increased in the channel region. The capacitance between the gate and the substrate in the gate-source and drain overlapping region becomes smaller than that in the channel region. This tendency becomes stronger as the partition wall becomes thicker.

In the FeFET produced according to the present invention, since the groove, in which the ferroelectric is embedded, is shallow, the ferroelectric film can be formed by a film forming method, in which the step coverage property is not necessarily high like metal organic compound decomposition method (MOD) by spin coating, or physical film formation method such as sputtering etc. It is desirable that a relative dielectric density of the ferroelectric material, which is embedded in the shallow groove, according to the present invention is smaller than 100.

As described above, according to the present invention, the gate laminated structure of the high aspect ferroelectric gate transistor (FeFET), in which the channel length is equal to or smaller than 100 nm and the effective thickness is equal to or larger than double of the channel length, can be produced without etching the hardly etched ferroelectric material. However, in order to make use of the advantage that the FeFET can be produced without etching of the ferroelectric layer, it is necessary to improve a circuit producing also in the case where the FeFET is integrated into a circuit. That is, it is necessary to improve a circuit layout that reduces the frequency of formation of contact holes requiring etching of the ferroelectric layer.

NAND type flash memory arrays and NOR type flash memory arrays are suitable examples of integration of FeFET into circuit. These flash memories are called ferroelectric NAND and ferroelectric NOR. In any of the ferroelectric NAND and ferroelectric NOR memory arrays, one memory cell is one FeFET. If the minimum processing length characterized by the generation of semiconductor process is F, the ferroelectric NAND has characteristics that it reduces the occupation area of one memory cell to $4F^2$, and it restricts the method of accessing memory cells by rules instead of high integration degree. In the ferroelectric NOR, instead of enabling random access to a memory cell, it is accepted that the occupation area of one memory cell is loosened lower than $4F^2$ to reduce the degree of integration. In the ferroelectric NAND, due to its high degree of integration, the frequency of contact hole formation has already been kept to a minimum. On the other hand, because the ferroelectric NOR has a high frequency of formation of contact holes for source or drain terminals in the conventional layout of the memory cell, the advantage that the gate laminated structure of the buried type FeFET can be produced without ferroelectric etching could not be fully utilized.

Figure 30A:
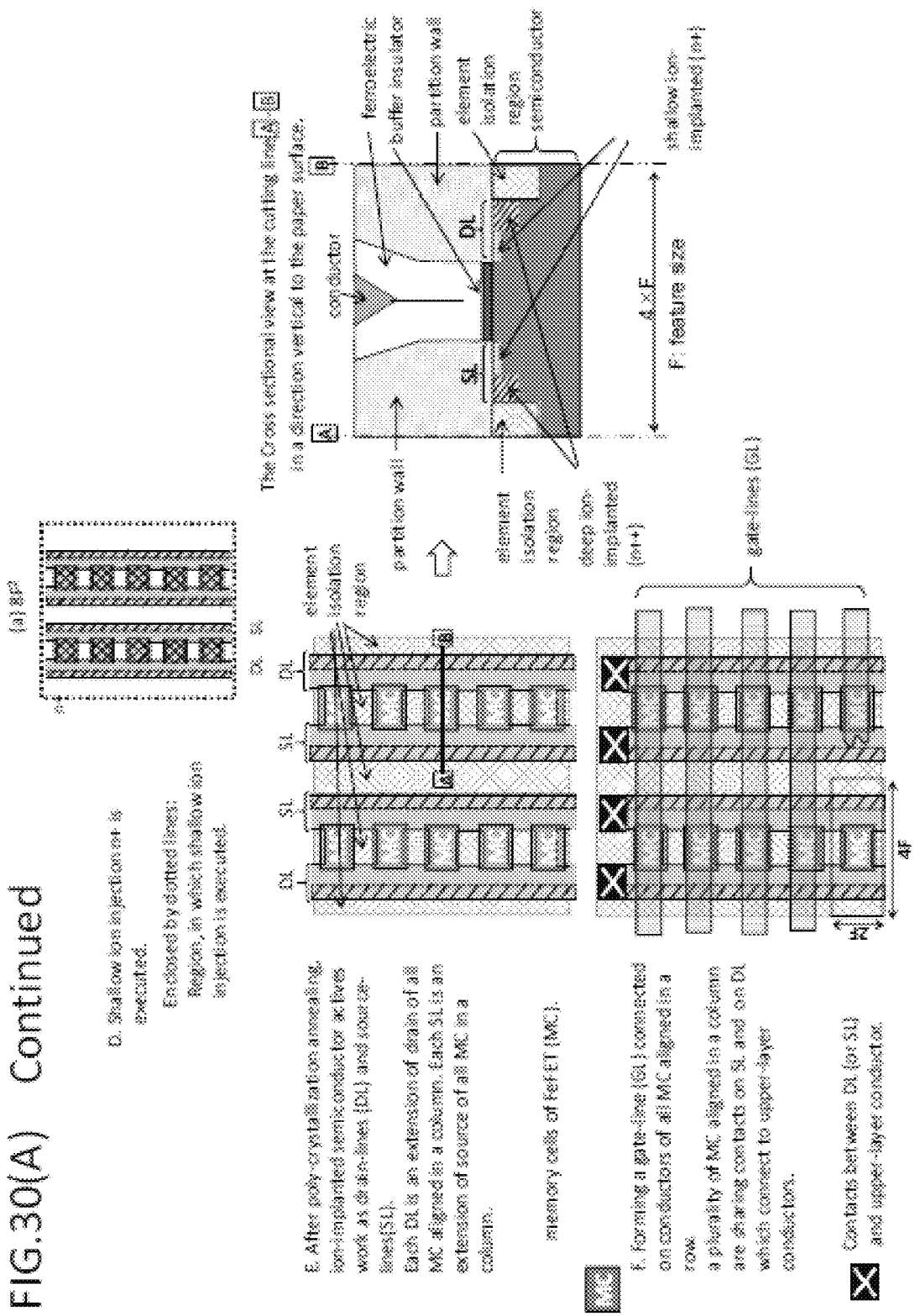

The present invention provides the ferroelectric NOR memory cell array capable of random access to a memory cell and having a low contact hole formation frequency. A memory cell array of the ferroelectric NOR according to the present invention is characterized by the shape of the active region formed on the semiconductor substrate. For example, FIG. 30 shows a shape of the active region on the semiconductor substrate of the ferroelectric NOR. FIG. 30(a) shows the case where the occupation area of one memory cell is $8F^2$, and FIG. 30(b) shows the case where the occupation area is $6F^2$. These active regions are characterized by a ladder-like shape. By adopting this shape, it is possible to short-circuit the drain regions, to which a common potential is desired, without passing through the contact hole. Similarly, it is possible to short-circuit the source regions, to which a common potential is to be applied, without passing through contact holes. The memory cell array of the ferroelectric NOR according to the present invention does not limit the shape and production method of the memory cell FeFET. That is, the memory cell constituting the memory cell array of the ferroelectric NOR according to the present invention may be an embedded type FeFET or a planar type FeFET. Taking the case, where one memory cell is an embedded type n channel type FeFET, as an example, the outline of the production process of the memory cell array of the ferroelectric NOR is illustrated from process A to F for the case where the occupation area of one memory cell is $8F^2$ (FIG. 30(a)) and $6F^2$ (FIG. 30(b)). The memory cell FeFET expresses the case of the embedded type in the figures of process C in FIG. 30(a) and FIG. 30(b), but it may be the planar type as described above.

Figure 31A:
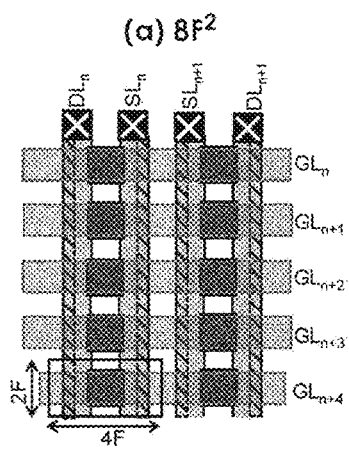
FIGS. 31(a) and 31(b) show views describing equivalent circuits of a memory cell array according to one or more embodiments.
Figure 31A:
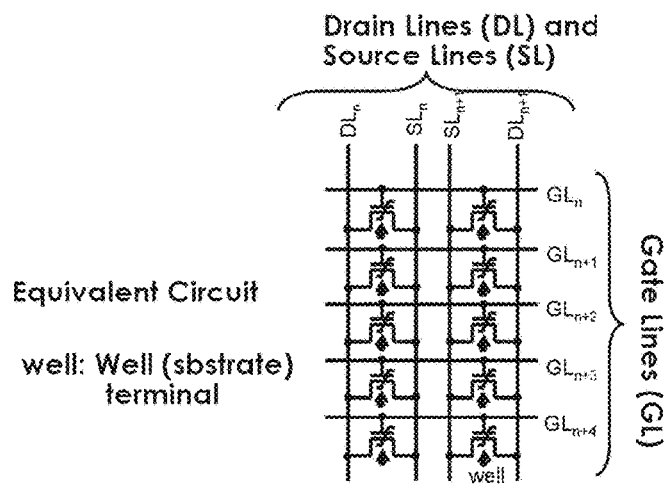
Figure 31B:
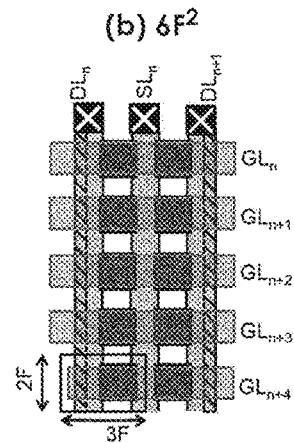
Figure 31B:
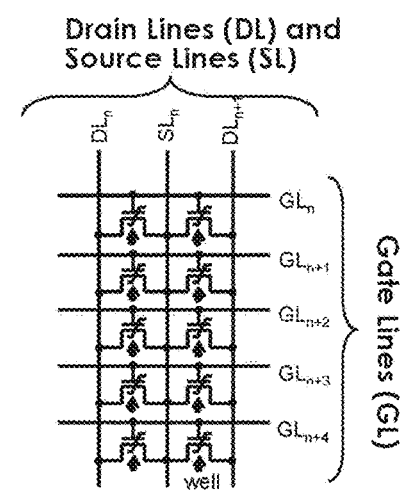

Equivalent circuit of the memory cell array of the dielectric NOR are shown in FIG. 31(a), in which the occupation area of one memory is $8F^2$, and in FIG. 31(b), in which the occupation area is $6F^2$. The substrate terminals of the memory cells sharing one memory cell array are at the same potential and this potential is called a well potential. As shown in process A of FIG. 30(a) and FIG. 30(b), the well is formed by executing a deep ion injection at a region, which becomes memory cell array, before forming a ladder-like active region and an element isolation region, which becomes a contour of the active region. N-type well may be deeply and widely formed in advance so that the p-type well, which is common to the memory cells, becomes a shape surrounding both two-dimensionally in-plane and in depth direction.

Figure 32A:
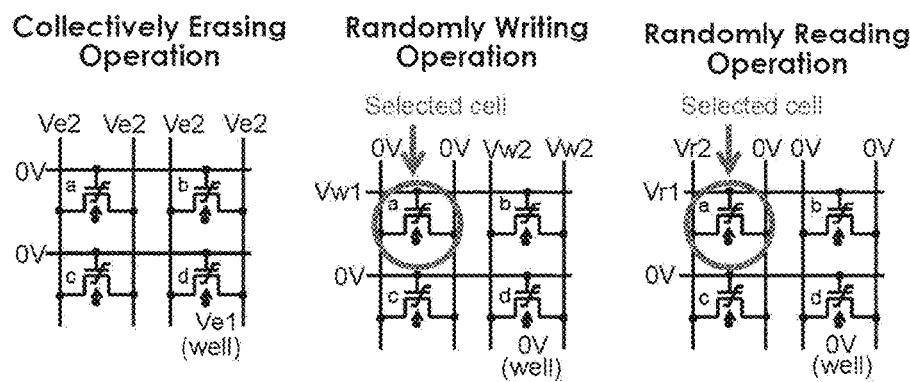
FIGS. 32(a) and 32(b) show views describing operating conditions of a memory cell array according to one or more embodiments.
Figure 32B:
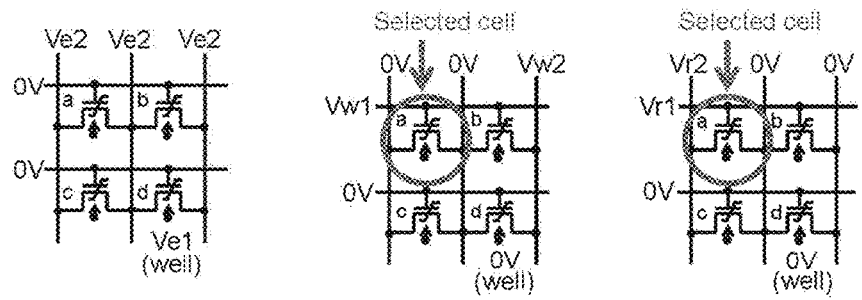

Examples of a voltage application condition for operating the ferroelectric NOR according to the present invention are shown in FIG. 32(a), in which the occupation area of one memory cell is $8F^2$, and FIG. 32(b), in which the occupation area is $6F^2$. In the example of FIGS. 32(a) and 32(b), the memory cell is an n channel type FeFET. The memory cell may be an embedded type FeFET or a planar type FeFET. When an Id-Vg characteristics of the n-channel type FeFET is measured, the Id-Vg hysteresis curve is drawn in the anticlockwise rotation. Roughly speaking, when a negative voltage pulse is applied to the gate terminal with compared to the substrate terminal, the threshold (Vth) of the FeFET becomes high, and when a positive voltage pulse is applied to the gate terminal with compared to the substrate terminal, the FeFET Vth is low. On the other hand, an electron capture type flash memory cell such as a floating gate type or MONOS type exhibits an Id-Vg curve, whose direction is opposite to that of the FeFET. For example, when an Id-Vg characteristic of an n-channel type electron capture type flash memory cell is measured, the Id-Vg hysteresis curve is drawn in the clockwise rotation.

The operation of the ferroelectric NOR memory cell array is described with reference to examples of FIGS. 32(a) and 32(b). In order to cover all the operating conditions, it suffices that there are four memory cells a, b, c, and d. Firstly, the ferroelectric NOR memory cell arrays are erased at once. In the collective erase operation, a positive voltage pulse is applied to the substrate terminal, which is the n well, with compared to the gate terminal of the n channel type FeFET, which is the memory cell. This is relatively the same as applying a negative voltage pulse to the gate terminal with compared to the substrate terminal. Therefore, Vth of memory cells a, b, c and d are aligned on the higher side by the collective erase. Next, it is randomly written in the memory cell array of the ferroelectric NOR. In this random write operation, a positive voltage pulse is applied to the gate terminal with compared to the substrate terminal, which is the n well, of the memory cell a, which is selected for writing, and the Vth of the memory cell a is moved to the lower side.

When writing to the selected memory cell a, it is required that variations of the Vth of the unselected memory cells b, c and d are small independent of the high or low at that time. That is, write disturbance tolerance is required for the memory cell array of the ferroelectric NOR. Also, when reading the selected memory cell a, it is required that the variation of the Vth of the selected memory cell a is small even when the read operation is repeated, and the variations of the Vth of the unselected memory cells b, c and d are small independent of the high or low at that time. That is, read disturbance tolerance is required for the memory cell array of the ferroelectric NOR.

The ferroelectric NOR according to the present invention has a characteristic that the write disturbance tolerance in the case of $8F^2$ (FIG. 30(a)) is higher than that in the case of $6F^2$ (FIG. 30(b)). This is explained below. Assuming the case where the occupation area of one memory cell is $8F^2$ (FIG. 33(a)) and the case of $6F^2$ (FIG. 33(b)), the write disturbance tolerance of the ferroelectric NOR was examined for the two most severe conditions. That is, when writing to the selected memory cell a, it is checked whether the unselected memory cell b is in the erase state and can maintain its erase state or not, and whether the unselected memory cell d in the write state can maintain its write state or not. More specifically, in the process of collectively erasing data with the erasing condition: Ve1=Ve2=5.7 V and randomly selecting and writing to the memory cell with the writing condition: Vw1=7.2 V, a situation was assumed that data is being written the selected memory cell a adjacent to the unselected memory cells b and d. At this time, it was assumed that unselected memory cell b was not selected after erasing, and unselected memory cell d was not selected after writing. Voltage conditions corresponding to the two most severe conditions of write disturbance are applied to these memory cells b and d, and then the read operation is performed to measure Vth. As a memory cell, one planar type FeFET having a gate area size of L=10 μm and W=150 μm was prepared. The gate laminated structure is Ir/CSBT/HfO$_2$/Si. The film thickness of CSBT is about 400 nm. Using the notation of FIGS. 32(a) and 32(b), it was judged that the erasing condition is Ve1=Ve2=5.7 V, the writing condition is Vw1=7.2 V, the reading condition is Vr1=1.6 V, Vr2=0.1 V, and Vg indicating Id=1.5E-6A is Vth. The width of the write voltage pulse was 10 μs and the width of the erase voltage pulse was sufficiently longer to be 1 ms. The case that the area occupied by one memory cell is $8F^2$ (FIG. 33(a))

The state of memory cell b was erased at Ve1=Ve2=5.7 V, and the initial value of Vth was Vth=1.52 V. The state of memory cell d was written at Vw1=7.2 V, and the initial value of Vth was Vth=0.46 V. It was assumed that writing is performed only to the adjacent memory cell a while the write or erase state of these memory cells b and d is maintained. Specifically, Vw1=7.2 V and Vw2 (variable) were applied, and Vth of memory cells b and d were read at each time. Vw2 (variable) was varied from 0 V to 7.2 V.

Figure 33A:
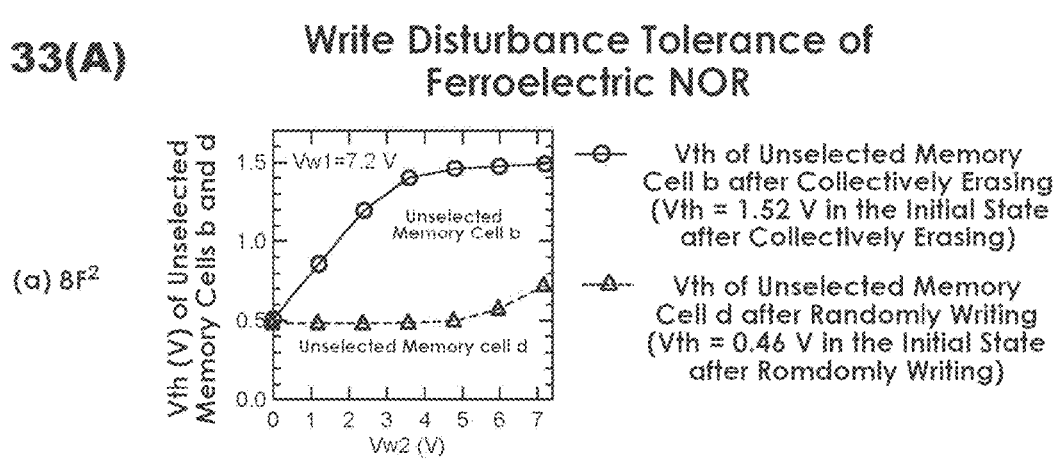
FIGS. 33(a) and 33(b) show views indicating a measurement result of write disturbance tolerance of the memory cell array according to the present invention.

As a result, as shown in FIG. 33(a), the difference ΔVth between Vth of memory cell b and Vth memory cell d when Vw2=4.8 V was ΔVth=0.96 V, and it was the maximum in the range of 0 V≤Vw2≤7.2 V. When Vw2=4.8 V, Vth=1.46 V of the memory cell b and Vth=0.50 V of the memory cell d were read respectively.

Figure 33B:
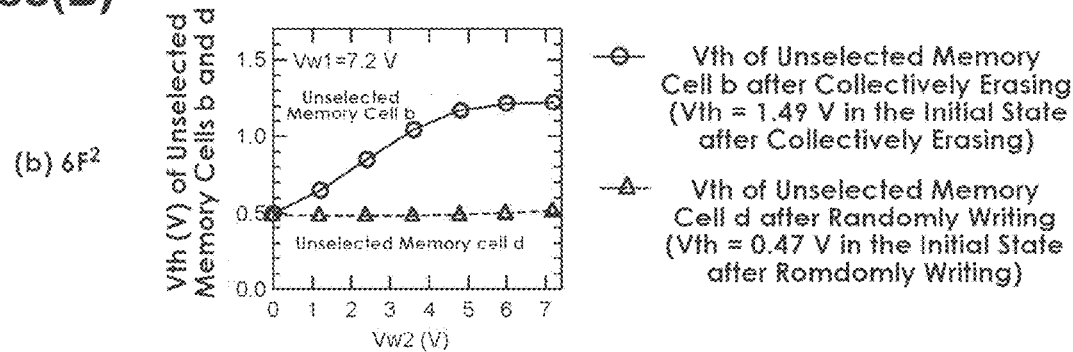

The case that the area occupied by one memory cell is $6F^2$ (FIG. 33(b))

The state of memory cell b was erased at Ve1=Ve2=5.7 V, and the initial value of Vth was Vth=1.49 V. The state of memory cell d was written at Vw1=7.2 V, and the initial value of Vth was Vth=0.47 V. It was assumed that writing is performed only to the adjacent memory cell a while the write or erase state of these memory cells b and d is maintained. Specifically, Vw1=7.2 V and Vw2 (variable) were applied, and Vth of memory cells b and d were read at each time. Vw2 (variable) was varied from 0 V to 7.2 V.

As a result, as shown in FIG. 33(b), the difference ΔVth between Vth of memory cell b and Vth memory cell d when Vw2=7.2 V was ΔVth=0.70 V, and it was the maximum in the range of 0 V≤Vw2≤7.2 V. When Vw2=7.2 V, Vth=1.22 V of the memory cell b and Vth=0.52 V of the memory cell d were read respectively.

From the above result, when the occupation area of 1 memory cell is $8F^2$, it is possible to select Vw2 such that the difference between Vth of memory cell b and memory cell d becomes larger than the case where the occupation area is $6F^2$. Then, it can be said that the write disturbance tolerance in the case of $8F^2$ is higher and better.

Figure 34A:
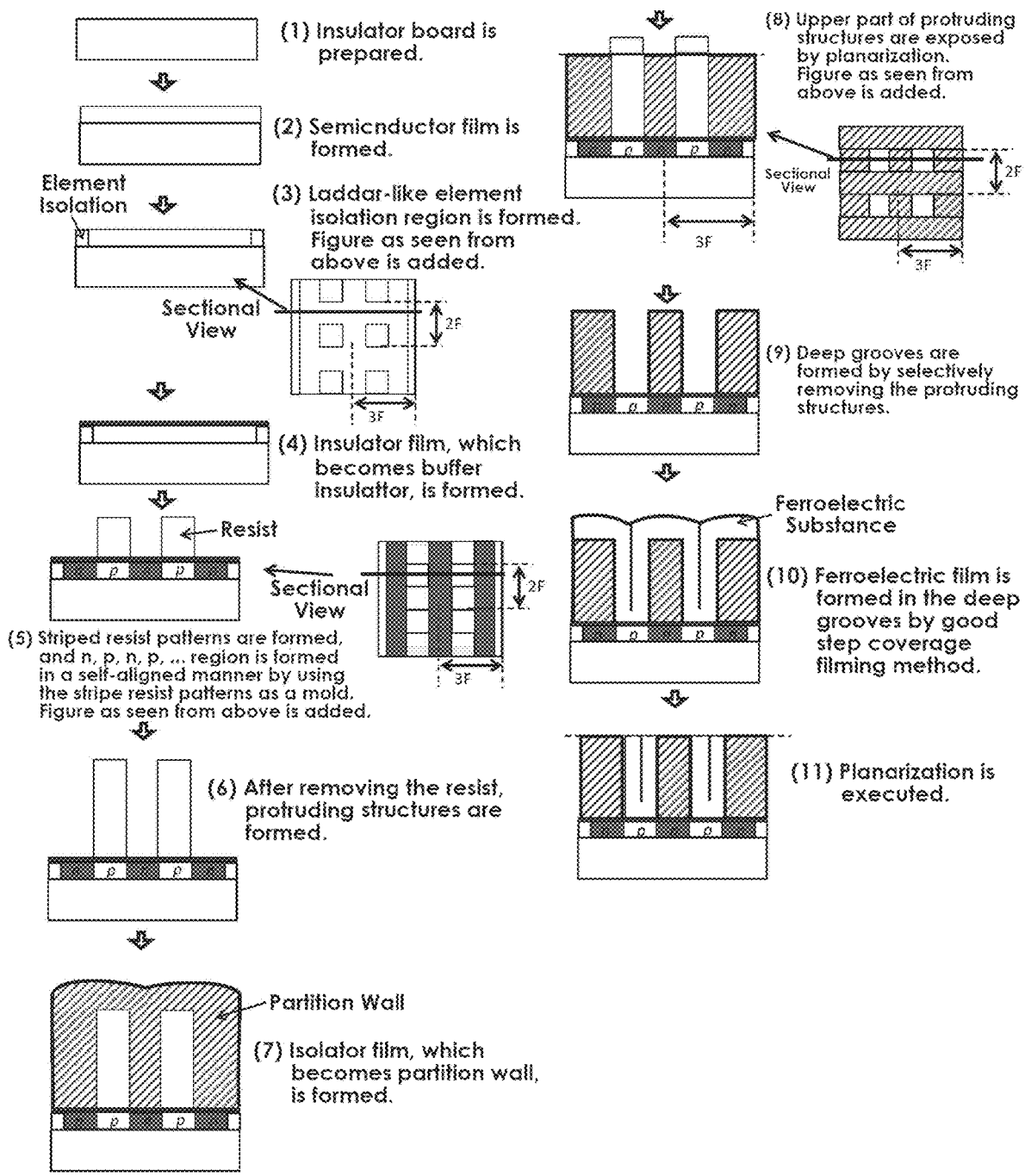
FIGS. 34(a)-34(c) show views indicating an overview of a production process of a multilayer memory cell array, in which the occupation area of one memory cell is $6F^2$ and random access is possible, according to the present invention.
Figure 34B:
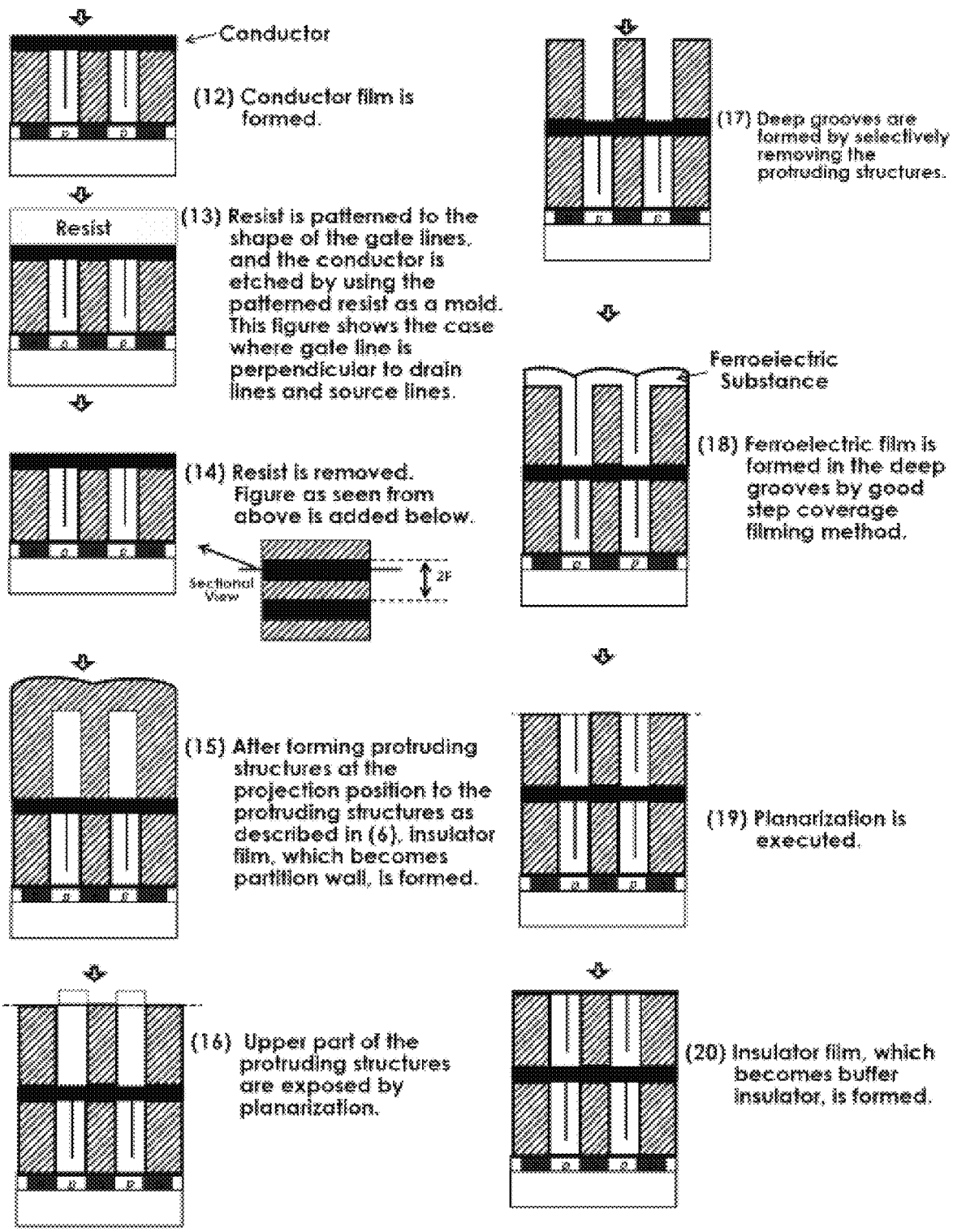
Figure 34C:
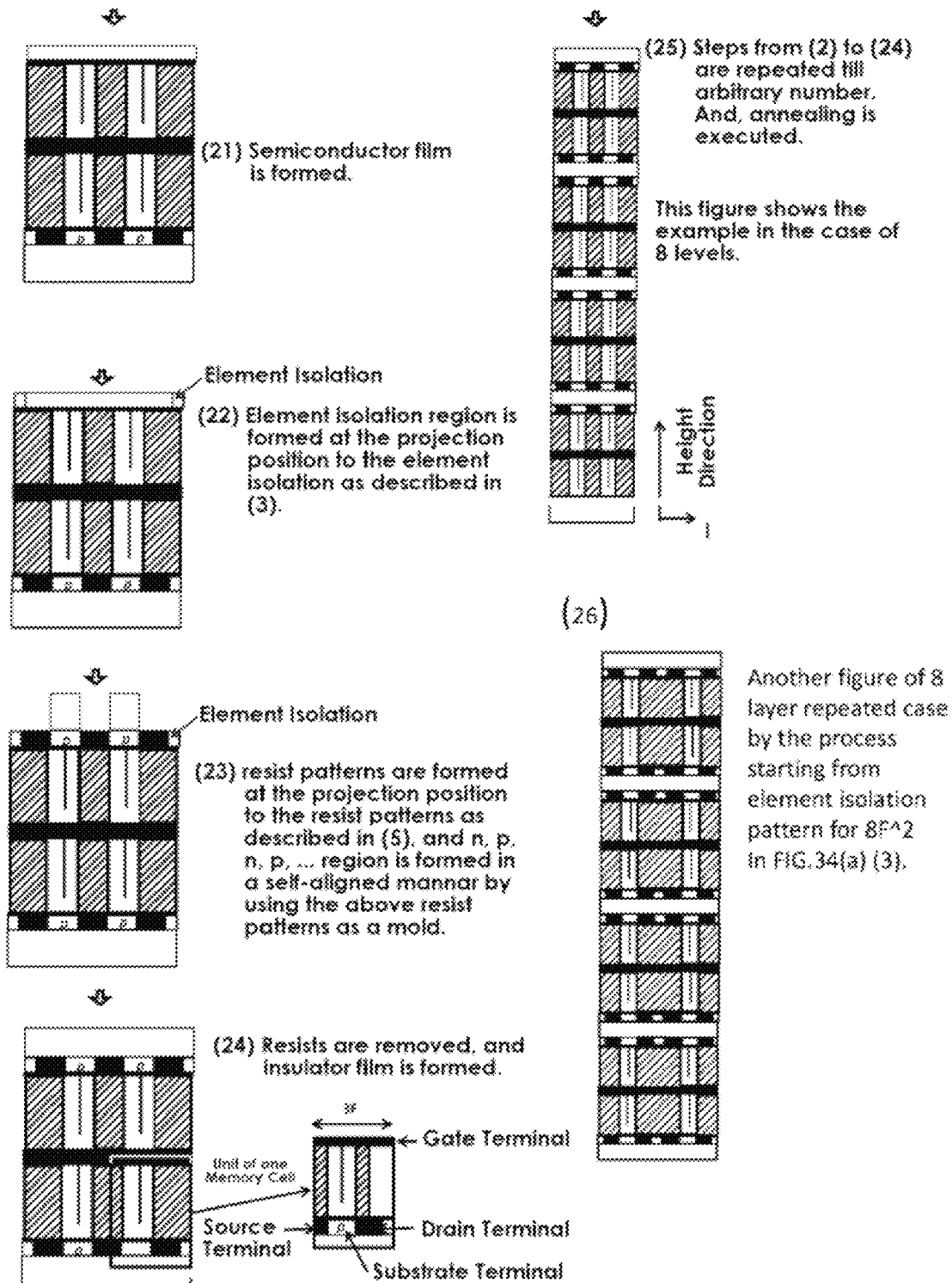
Figure 35A:
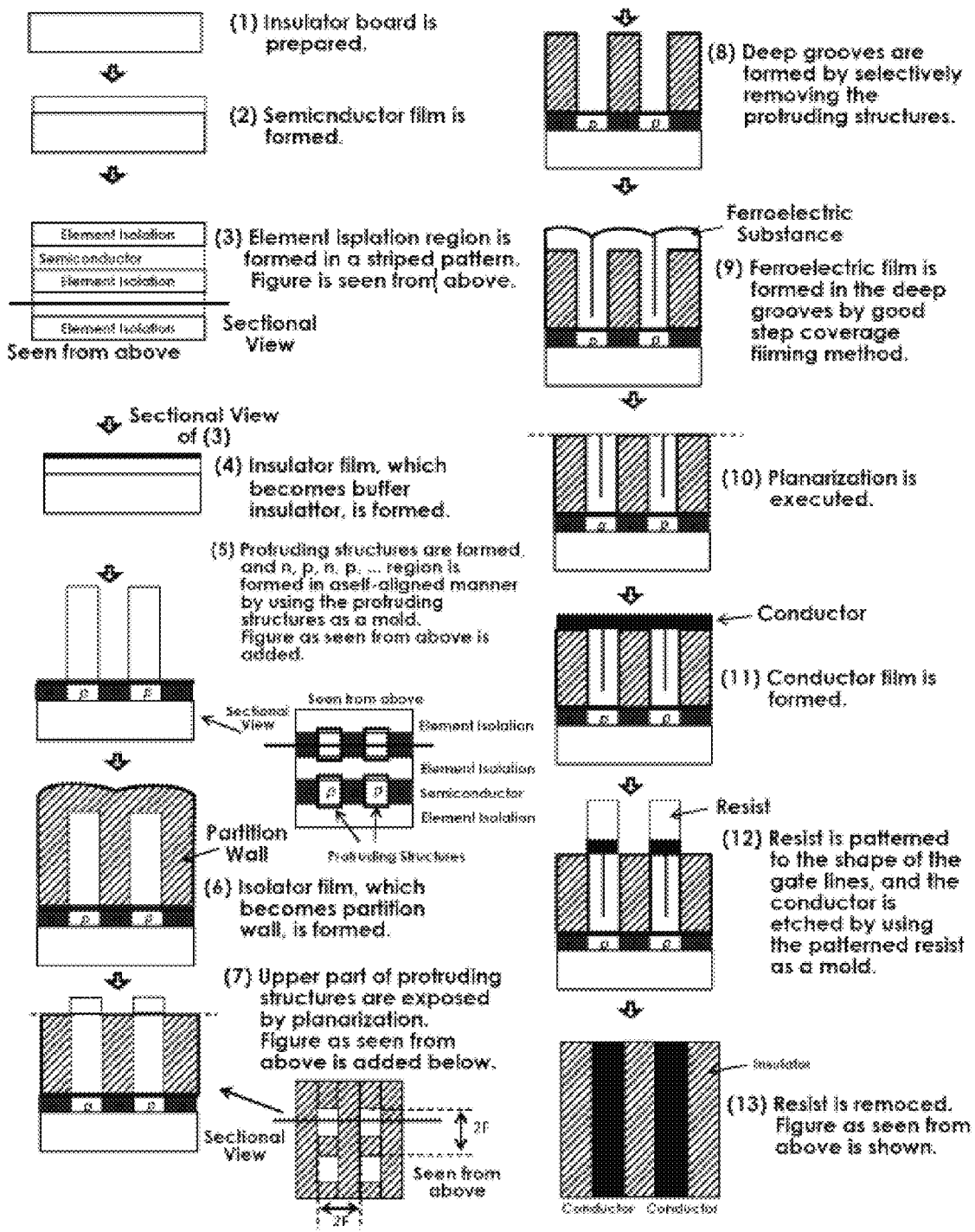

Also, according to the present invention, the gate laminated structure of the high aspect ferroelectric gate transistor (FeFET), in which the channel length is equal to or smaller than 100 nm and the effective thickness is equal to or larger than double of the channel length, can be produced without etching the hardly etched ferroelectric material. By making use of this advantage, it is possible to produce a memory cell array, in which FeFET are three-dimensionally integrated as memory cells. FIGS. 34(a)-34(c) show examples of the production method of the ferroelectric NOR memory cell array, and FIGS. 35(a)-35(c) show examples of the production method of the ferroelectric NAND memory cell array. Since the production process of the three-dimensional memory cell array according to the present invention is basically the same as the production process of the above-mentioned memory cell alone except that the semiconductor is formed by film formation, the detailed description is omitted. The semiconductor formed by film formation indicates a semiconductor based on an oxide semiconductor of zinc (Zn), gallium (Ga), indium (In), tin (Sn), or a composite oxide thereof. It also indicates a semiconductor such as polysilicon, in which the production method is film deposition rather than single crystal bulk growth.

In both ferroelectric NOR memory cell array (FIGS. 34(a)-34(c)) and ferroelectric NAND memory cell array (FIGS. 35(a)-35(b)), memory cells are regularly arranged in two rows and two columns or more in the plane, and both are memory cell arrays stacked in two levels or more in the height direction. The nearest neighboring layers pair to each other in the height direction, and memory cells are laminated with a positional relation of mirror image inversion up and down with a shared gate terminal interposed therebetween in each pair. According to the present invention, a memory cell array with a low bit cost can be provided by having high integration of $6F^2$ shown in FIGS. 34(a)-34(c) and $4F^2$ shown in FIGS. 35(a)-35(c) in one layer and stacking in multiple n levels.

What is claimed is:

1. A semiconductor memory element, comprising:
a semiconductor substrate having a source region and a drain region;
a buffer insulator formed on the semiconductor substrate;
a stacked ferroelectric formed on the buffer insulator;
a stacked conductor formed on the stacked ferroelectric; and
a partition wall surrounding a side surface of the stacked ferroelectric,
wherein a cross-sectional area of the stacked ferroelectric parallel with the semiconductor substrate is narrowest at a bottom surface of the stacked ferroelectric, a length (L) between the source region and the drain region being equal to or smaller than 100 nm,
a distance (H) between the stacked conductor and the bottom surface of the stacked ferroelectric is equal to or greater than double the length (L),
the semiconductor memory element has an intensity of the memory function that becomes stronger as L decreases in a range of L≤(2×k×d) and that disappears when L>(2×k×d),
where d: a controlled film thickness of the stacked ferroelectric which is measured on a flat surface, and
k: a ratio of ferroelectric film-forming speed on an inner wall surface and a horizontal surface of a groove defined by the partition wall, where 0<k≤1.

2. The semiconductor memory element according to claim 1,
wherein an area of cross section parallel to the semiconductor substrate of said ferroelectric does not decrease with increase of the distance of said cross section from a bottom surface of said ferroelectric.

3. The semiconductor memory element according to claim 1,
wherein said ferroelectric is a bismuth layered perovskite type ferroelectric substance.

4. The semiconductor memory element according to claim 1,
wherein said partition wall comprises a lamination of two or more materials having different etching rates to the wet etching or ion-reactive-plasma dry etching a protruding structure.

5. The semiconductor memory element according to claim 1,
wherein said memory substance further comprises a buffer insulator having a higher dielectric constant than a dielectric constant of said partition wall between said semiconductor substrate and said ferroelectric.

6. The semiconductor memory element according to claim 1,
said source region, said drain region, and a channel region are portions of said semiconductor not overlapping each other,
the channel region is sandwiched between said source region and said drain region,
said channel region is in contact with the bottom surface of said memory substance, and
the area of said bottom surface shares boundaries with said source region and with said drain region individually.

7. A memory cell array, comprising:
a plurality of memory cells, each memory cell being the semiconductor memory element according to claim 6, the memory cells being arranged at regular intervals in rows and columns in a plane parallel to said semiconductor substrate, the number of the rows and columns being two or more;
a plurality of gate lines lying along the rows, each gate line being assigned to a separate row of memory cells, the gate line being connected with said conductors of the memory cells belonging to the row; and
pairs of drain lines and source lines lying along the columns and across the rows, each drain line being assigned to a separate column of memory cells, said drain regions of the memory cells belonging to a column are extended and merged with the corresponding drain line, an active region is used for electric transmission between the drain regions and the drain lines without via contacts, each source line being assigned to a separate column of memory cells, said source regions of the memory cells belonging to a column are extended and merged with the corresponding source line, the active region being used for electric transmission between the source regions and the source lines without via contacts, the active region being defined as an electric-conductive region in a semiconductor excluding element isolation region.

8. The memory cell array according to claim 7, wherein two adjacent columns of memory cells share a source line.

9. A memory cell array comprising:
two or more stacked layer units, each layer unit comprising said memory cell array according to claim 8,
wherein the two layers vertically adjacent in the normal direction of the substrate plane are paired with each other in the top-to-down inverted mirror image, and
upper and lower memory cells are located in plane symmetry with one of the gate lines interposed therebetween, sharing the gate line.

10. A memory cell array comprising:
two or more stacked layer units, each layer unit comprising said memory cell array according to claim 7,
wherein two layers of the layer units vertically adjacent in the normal direction of the substrate plane are paired with each other in the top-to-down inverted mirror image, and
upper and lower memory cells are located in plane symmetry with one of the gate lines interposed therebetween, sharing the gate line.

11. A production method of the semiconductor memory element of claim 1, the production method comprising:
forming the buffer insulator on the semiconductor substrate;
forming a protruding structure erected on the buffer insulator which is formed on the semiconductor substrate, a projection area of said protruding structure on said semiconductor substrate covering a channel region,
said channel region being sandwiched with a source and a drain region,
said channel region, said source region, and said drain region being portions of said semiconductor not overlapping each other,
said protruding structure having a length (L) that is equal to or smaller than 100 nm,
said protruding structure having a height that is equal to or larger than double the length (L);
covering said protruding structure with the partition wall;
shaving said protruding structure covered with said partition wall in a direction from a top of said protruding structure to said semiconductor substrate;
selectively removing said protruding structure to form the groove having a width that is equal to or smaller than 100 nm in said partition wall;
forming the stacked ferroelectric in the groove, the stacked ferroelectric being taller than 2L in height (H); and
forming the stacked conductor on said stacked ferroelectric,
wherein H is the minimum distance between said stacked conductor and said buffer insulator, and
the semiconductor memory element has an intensity of the memory function which becomes stronger as d increases in the range of $d \geq L/(2k)$ and disappears when $d < L/(2k)$,
where d: a controlled film thickness of the ferroelectric which is measured on a flat surface,
k: $k = Vb/Va$,
Va(nm/sec): a film forming speed on a horizontal plane, and
Vb(nm/sec): a film forming speed on an inner wall of the groove.

12. The production method according to claim 11, wherein said ferroelectric is a bismuth layered perovskite type ferroelectric.

13. The production method according to claim 11, wherein said protruding structure consists of organic substances, said partition wall consists of inorganic substances, and said protruding structure is selectively removed by an oxygen plasma etching.

14. The production method according to claim 11, wherein the protruding structure consists of a lamination of two or more layers,
the method further comprising:
selectively removing said protruding structure comprises selectively removing the two or more layers except for the bottom layer.

15. The production method according to claim 11, wherein said semiconductor substrate consists of a lamination of two or more layers.

16. The production method according to claim 11, wherein said partition wall consists of a lamination of two or more materials with different etching rates to wet etching or ion-reactive-plasma dry etching the protruding structure.

17. The production method according to claim 11, further comprising creating a slope at an opening of the groove such that the opening becomes wider toward the top from said semiconductor substrate.

18. The production method of a ferroelectric gate transistor, the method comprising:
forming the source region and the drain region in self-alignment to said protruding structure in said semiconductor before forming the partition wall; and
placing a ferroelectric material in said groove obtained by the method according to claim 11.

19. The production method of the ferroelectric gate transistor according to claim 18,
wherein said ferroelectric material placed in said groove includes a ferroelectric film formed by a metal organic chemical vapor deposition.

20. A production method of an electronic circuit, the method comprising:
obtaining the electronic circuit consisting of two or more semiconductor memory elements according to claim 1, the semiconductor memory elements being obtained by providing two or more widths of said protruding structure;

simultaneously forming memory substance films in two or more grooves of the semiconductor memory elements having different widths of the two or more widths of said protruding structure; and controlling the height of said memory substance filled in said respective grooves from the semiconductor substrate by changing the widths of said grooves and varying the strength of the memory function of the respective elements.

21. A production method of a ferroelectric gate transistor, the method comprising:

forming a protruding structure on the semiconductor substrate of the semiconductor memory element according to claim 1;

forming the source region and the drain region in self-alignment to said protruding structure;

forming the partition wall so that said partition wall covers a top of said semiconductor and said protruding structure;

shaving said protruding structure and said surrounding partition wall in the direction from the top of said protruding structure to said semiconductor;

forming the groove by selectively removing said protruding structure so that the height of said partition wall, which is a wall surface of said groove, is equal to or lower than the height of said partition wall at a position away from a center of said groove by a distance corresponding to the width of said groove; and placing a ferroelectric material into said groove.

22. A memory cell array comprising:

a plurality of memory cells, each memory cell being the semiconductor memory element according to claim 1, said memory cells being arranged regularly in two rows and two columns or more in a substrate plane to form a layer unit, wherein two layers of the memory cells vertically adjacent in the normal direction of the substrate plane are paired with each other in the top-to-down inverted mirror image, and upper and lower ones of the memory cells are located in plane symmetry with the conductor interposed therebetween, sharing the conductor.

\* \* \* \* \*